US007567196B2

(12) United States Patent
Boemler

(10) Patent No.: US 7,567,196 B2
(45) Date of Patent: Jul. 28, 2009

(54) METHOD OF CONTROLLING DIGITAL-TO-ANALOG CONVERSION

(75) Inventor: Christian Boemler, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/149,355

(22) Filed: Apr. 30, 2008

(65) Prior Publication Data

US 2008/0258954 A1    Oct. 23, 2008

Related U.S. Application Data

(62) Division of application No. 11/364,069, filed on Mar. 1, 2006, now Pat. No. 7,385,547, which is a division of application No. 10/929,578, filed on Aug. 31, 2004, now Pat. No. 7,151,475.

(51) Int. Cl.
H03M 1/66 (2006.01)
(52) U.S. Cl. .................. 341/144; 341/145; 341/150
(58) Field of Classification Search .......... 341/144, 341/145, 150; 345/211
See application file for complete search history.

(56) References Cited

U.S. PATENT DOCUMENTS

| | | | |
|---|---|---|---|
| 5,068,660 A | 11/1991 | Swanson et al. | |
| 5,283,484 A | 2/1994 | Brehmer et al. | |
| 5,416,484 A | 5/1995 | Lofstrom | |
| 5,563,598 A | 10/1996 | Hickling | |
| 5,821,795 A | 10/1998 | Yasuda et al. | |
| 5,886,659 A | 3/1999 | Pain et al. | |
| 6,067,037 A * | 5/2000 | Kato | 341/150 |
| 6,084,538 A | 7/2000 | Kostelnik et al. | |
| 6,111,529 A | 8/2000 | Maulik et al. | |
| 6,144,326 A | 11/2000 | Krone et al. | |
| 6,255,979 B1 | 7/2001 | Allee et al. | |
| 6,271,785 B1 | 8/2001 | Martin et al. | |
| 6,289,070 B1 | 9/2001 | Krone et al. | |
| 6,323,796 B1 | 11/2001 | Krone et al. | |
| 6,377,303 B2 | 4/2002 | O'Connor | |
| 6,442,213 B1 | 8/2002 | Krone et al. | |
| 6,456,220 B1 | 9/2002 | Leung et al. | |
| 6,459,338 B1 | 10/2002 | Acosta et al. | |
| 6,504,499 B1 | 1/2003 | Masenas et al. | |
| 6,518,898 B1 | 2/2003 | Choksi | |
| 6,624,772 B1 | 9/2003 | Gealow et al. | |
| 6,674,386 B2 | 1/2004 | Carreau et al. | |
| 6,791,484 B1 | 9/2004 | Lee et al. | |

(Continued)

Primary Examiner—Jean B Jeanglaude
(74) Attorney, Agent, or Firm—Dickstein Shapiro LLP

(57) ABSTRACT

An analog-to-digital converter having a minimal amount of circuitry for conversion of an input analog signal to a series of digital bits. A differential comparator is provided for generating digital values to which the digital bits correspond. A pair of digital-to-analog converters are provided for generating, via successive approximation, a differential feedback analog signal based on bits previously generated by the differential comparator. The analog-to-digital converter compares the differential feedback analog signal to the input analog signal, and based on the comparison generates a digital value that corresponds to a digital bit. In the method of the invention, an analog signal is converted to a digital value using the analog-to-digital converter, and a pair of digital-to-analog converters each generate, via successive approximation, a differential feedback analog signal that is applied to a differential comparator for comparison to the input analog signal being digitized.

10 Claims, 20 Drawing Sheets

U.S. PATENT DOCUMENTS

| | | |
|---|---|---|
| 6,809,672 B2 | 10/2004 | Gupta |
| 6,831,507 B2 | 12/2004 | Granville |
| 6,839,009 B1 | 1/2005 | Ali |
| 6,873,278 B1 * | 3/2005 | Ferguson et al. ............ 341/144 |
| 6,873,281 B1 | 3/2005 | Esterberg et al. |
| 6,909,391 B2 | 6/2005 | Rossi |
| 6,917,321 B1 * | 7/2005 | Haurie et al. ............... 341/144 |
| 6,937,279 B1 | 8/2005 | Kim et al. |
| 7,015,844 B1 | 3/2006 | Boemler |
| 7,136,058 B2 * | 11/2006 | Nakamura et al. .......... 345/211 |
| 7,151,475 B2 | 12/2006 | Boemler |
| 2002/0121996 A1 * | 9/2002 | Kuttner ..................... 341/145 |
| 2004/0099920 A1 | 5/2004 | Rosse et al. |
| 2005/0057389 A1 | 3/2005 | Krymski |

* cited by examiner

Vsig=1V    Vcm=1.65V    Vin+=|Vin+Vcm|=1.91645V

Vin-diff=0.53291V    VrefL=0.8V    VrefH=2.5V    Vin+=|Vin-Vcm|=1.38545V

N=10 (i.e., 10 BITS RANGING FROM BIT9 THROUGH BIT0)    DACreset=1/2(VrefL+VrefH)=1/2(0.8V+2.5V)=1.65V

EXAMPLE BIT VALUES FOR BIT9 THROUGH BIT7 OF 10 BIT SERIES:

BIT BEING GENERATED: MSB BIT=N-1 (e.g., BIT9)

| PRIOR BITx BEING APPLIED FOR SAR | FIRST CAP. (VDAC1cap1) | SECOND CAP. (VDAC1cap2) | VDAC1Tempoutx | THIRD CAP. (VDAC2cap3) | FOURTH CAP. (VDAC2cap4) | VDAC2Tempoutx | VDAC-diff | Vin-diff | MEM 0 | MEM 1 | MEM 2 | MEM 3 | MEM 4 | MEM 5 | MEM 6 | MEM 7 | MEM 8 | MEM 9 |
|---|---|---|---|---|---|---|---|---|---|---|---|---|---|---|---|---|---|---|
| N/A (RESET) | 2.5V | 0.8V | 1.65V | 0.8V | 2.5V | 1.65V | 0V | 0.5329V | - | - | - | - | - | - | - | - | - | 1 |

BIT BEING GENERATED: SECOND MOST SIGNIFICANT BIT=N-2 (e.g., BIT8)

| PRIOR BITx BEING APPLIED FOR SAR | FIRST CAP. (VDAC1cap1) | SECOND CAP. (VDAC1cap2) | VDAC1Tempoutx | THIRD CAP. (VDAC2cap3) | FOURTH CAP. (VDAC2cap4) | VDAC2Tempoutx | VDAC-diff | Vin-diff | MEM 0 | MEM 1 | MEM 2 | MEM 3 | MEM 4 | MEM 5 | MEM 6 | MEM 7 | MEM 8 | MEM 9 |
|---|---|---|---|---|---|---|---|---|---|---|---|---|---|---|---|---|---|---|
| N/A (RESET) | 2.5V | 0.8V | 1.65V | 0.8V | 2.5V | 1.65V | N/A | N/A | - | - | - | - | - | - | - | - | - | 1 |
| X=i+1=9 MEM9= HIGH | 0.8V | 1.65V | 1.225V | 2.5V | 1.65V | 2.075V | 0.85V | 0.5329V | - | - | - | - | - | - | - | - | 0 | 1 |

BIT BEING GENERATED: THIRD MOST SIGNIFICANT BIT=N-3 (e.g., BIT7)

| PRIOR BITx BEING APPLIED FOR SAR | FIRST CAP. (VDAC1cap1) | SECOND CAP. (VDAC1cap2) | VDAC1Tempoutx | THIRD CAP. (VDAC2cap3) | FOURTH CAP. (VDAC2cap4) | VDAC2Tempoutx | VDAC-diff | Vin-diff | MEM 0 | MEM 1 | MEM 2 | MEM 3 | MEM 4 | MEM 5 | MEM 6 | MEM 7 | MEM 8 | MEM 9 |
|---|---|---|---|---|---|---|---|---|---|---|---|---|---|---|---|---|---|---|
| N/A (RESET) | 2.5V | 0.8V | 1.65V | 0.8V | 2.5V | 1.65V | N/A | N/A | - | - | - | - | - | - | - | - | 0 | 1 |
| X=i+1=8 MEM8= LOW | 2.5V | 1.65V | 2.075V | 0.8V | 1.65V | 1.225V | 1.225V | N/A | - | - | - | - | - | - | - | 1 | 0 | 1 |
| X=i+2=9 MEM9= HIGH | 0.8V | 2.075V | 1.4375V | 2.5V | 1.225V | 1.8625V | 0.425V | 0.5329V | - | - | - | - | - | - | - | 1 | 0 | 1 |

FIG. 15

METHOD OF CONTROLLING DIGITAL-TO-ANALOG CONVERSION

This is a divisional application of U.S. patent application Ser. No. 11/364,069, filed on Mar. 1, 2006, now U.S. Pat. No. 7,385,547 which is a divisional application of U.S. patent application Ser. No. 10/929,578, filed Aug. 31, 2004, now U.S. Pat. No. 7,151,475, issued Dec. 19, 2006, the disclosures of which are incorporated by reference in their entirety.

BACKGROUND OF THE INVENTION

The present invention relates generally to analog-to-digital converters in imager devices and to methods for using the same.

Background of the Invention

Analog-to-digital converters ("ADCs") convert an incoming analog signal to a corresponding series of digital bits. Image sensing devices (i.e., image sensors) generate analog signals that are typically converted by ADCs to digital bit values as part of image processing. Image sensors typically employ light detecting elements (e.g., photosensors) and are used in various applications. Such image sensors may be formed using a variety of fabrication techniques. Currently, two commonly fabricated image sensors are CMOS image sensors and charge coupled device (CCD) image sensors. Each sensor generally includes an array of pixels containing the photosensors. The image sensors typically use photosensors in the form of photogates, phototransistors or photodiodes.

When an image is focused on the image sensor array (also called an "imager array" or "pixel array"), light corresponding to the image is directed to the pixels usually through micro-lenses. Each micro-lens may be used to direct incoming light through a circuitry region of the corresponding pixel to the photosensor region, thereby increasing the amount of light reaching the photosensor. It is known in the art to use circuitry that includes storage regions (for example, floating diffusion regions) that collect pixel charge representing the light reaching the photosensors.

In a CMOS imager, the pixel array discharges this pixel charge as an analog voltage signal that is proportional to the light collected by the photosensor. It is known in the art to use row select transistors to select a particular row in the pixel array and cause the storage element (e.g., a floating diffusion region) for each pixel in the selected row to discharge its voltage for further processing by image sensor circuitry. In this way, the pixel array circuitry discharges the voltage stored in each column of the pixel array one row (i.e., the selected row) at a time. The discharged analog voltage signals may be used to replicate an image represented by the light incident on the photosensors of the array (i.e., the incident light). For example, the discharged analog voltage signals may be used to display a corresponding image on a monitor or to otherwise provide information about the image.

It is known in the art to convert analog voltage signals to digital signals using an ADC that uses a successive approximation ("SAR") method, where digital bit values are successively approximated using the values of previously generated bits. An ADC typically includes: a sample and hold circuit for sampling and holding analog signals; a comparator for comparing an input analog signal to a feedback analog signal and for outputting a corresponding digital value; memory for storing digital bit values; and a feedback loop comprising a digital-to-analog converter ("DAC") for generating the feedback analog signal. In operation, the DAC receives a digital value (e.g., a digital bit previously generated by the ADC) and outputs a corresponding analog signal that is applied to one of the comparator inputs and used to generate the next successive digital bit value of the digital bit series.

For a differential comparator, error signals also may arise due to offset values that are inherent to the differential comparator and therefore embedded in the differential comparator output. Such offset values are undesirable. Undesirable errors may also arise as a result of common mode error, or as a result of quiescent current variations in the differential comparator.

Successive approximation type ADCs that require one storage capacitor for storing the value of each bit of an N-bit series (i.e., N capacitors) are known in the art. For example, if ten bits are to be converted, the ADC circuitry includes ten capacitors. Such configurations require significant die area to accommodate the numerous circuit elements. Moreover, for high resolution ADCs, the size of the capacitors significantly increases from least significant bit ("LSB") to most significant bit ("MSB") in order to compensate for charge leakage and thermal noise on the MSB capacitor. For example, SARs with charge-sharing DACs are known where each of the N capacitors are sized $2^0, 2^1, 2^2, 2^4 \ldots 2^N$ relative to one another. Such SARs rely on capacitor matching and a large ratio from the largest capacitance to the smallest.

Other DACs having a limited number of capacitors (e.g., two) are known in the art. However, the comparator of these SAR ADCs typically process signals MSB first, LSB last, while serial DACs typically process bits LSB first, MSB last. In order to use such a DAC in an ADC, the comparator of the ADC must completely convert the analog input to digital values before the LSB is generated and DAC processing can begin. This is undesirable. Furthermore, these known SAR ADCs fail to compensate for offset or errors or other variations (e.g., common mode errors or quiescent current variations) prior to conversion of the pixel cell output (the analog signals) used to generate the digital bits which is undesirable.

DACs that process MSB first, LSB last are also known, but these DACs typically require integrator circuitry prior to transferring the analog output to a comparator. Such integrator circuitry requires additional electronic components (e.g., a separate comparator and a capacitor network) and takes up additional die space, which is undesirable.

Other DACs that process MSB first, LSB last are limited to use in monotonic DACs (i.e., the DACs' output either increases (for a digital input of 1) or stays the same (for an input of 0)). Thus, the DAC output is not sufficiently sensitive for high resolution applications such as image sensor applications.

Accordingly, there is a desire and need for an image sensor having a successive approximation type analog-to-digital converter comprising circuitry that includes a minimal number of circuit components that take up minimal die area.

There is also a need for an improved method of processing signals through an image sensor using a successive approximation type analog-to-digital-conversion method having a serial digital-to-analog converter that is capable of processing bits MSB first, LSB last.

There is further a need for an improved method of correcting for error signals in a successive approximation type analog-to-digital converter.

Further there is a need for an improved method of converting analog signals to digital signals using a successive approximation type analog-to-digital converter comprising a digital to analog conversion method for high resolution applications.

BRIEF SUMMARY OF THE INVENTION

The present invention provides an improved analog-to-digital converter and ADC conversion method for image sensors requiring one differential comparator, four capacitors and two buffers (e.g., reference selectors) for converting analog signals by successive approximation. The analog-to-digital converter includes two digital-to-analog converter circuits configured differentially, and a digital-to-analog conversion method requiring that only the more significant bits of the digital series be previously converted.

The above and other features and advantages are achieved in various exemplary embodiments of the invention by providing an analog-to-digital converter utilizing a differential comparator, memory, and two differentially configured digital-to-analog converter circuits. Successive approximation is used in the present invention to enable the digital-to-analog converter to process signals MSB first, LSB last.

BRIEF DESCRIPTION OF THE DRAWINGS

The foregoing and other advantages and features of the invention will become more apparent from the detailed description of exemplary embodiments provided below with reference to the accompanying drawings in which:

FIG. 15 is a chart of example bit values generated using the exemplary method of FIGS. 9-13.

DETAILED DESCRIPTION OF THE INVENTION

In the following detailed description, reference is made to the accompanying drawings which form a part hereof, and which illustrate specific embodiments of the present invention. These embodiments are described in sufficient detail to enable those of ordinary skill in the art to make and use the invention. It is also understood that structural, logical, or procedural changes may be made to the specific embodiments disclosed without departing from the spirit and scope of the present invention. The following detailed description is not to be taken in a limiting sense, and the scope of the present invention is defined only by the appended claims.

Figure 1A:
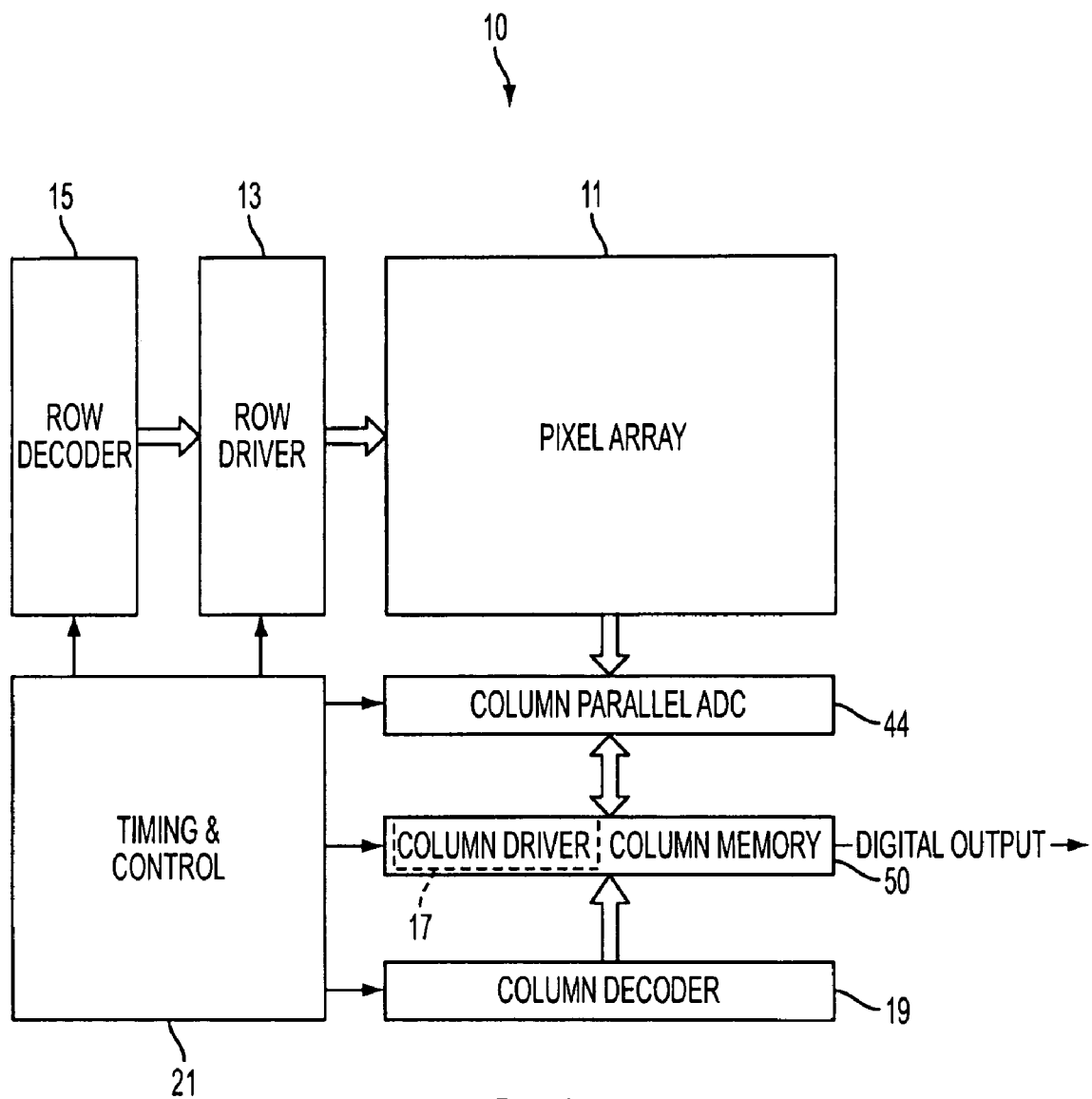
FIG. 1A is a block diagram of a conventional column parallel ADC image sensor.

FIG. 1A illustrates a block diagram for a CMOS imager 10. The imager 10 includes a pixel array 11. The pixel array 11 comprises a plurality of pixels arranged in a predetermined number of columns and rows. The pixels of a given row in array 11 are all turned on at the same time by a row select line and the pixels of a given column are selectively output by a column select line. A plurality of row and column lines (not shown) are provided for the entire array 11.

The row lines are selectively activated by the row driver 13 in response to row address decoder 15 and the column select lines are selectively activated by the column driver 17 in response to column address decoder 19. As shown in FIG. 1, the column driver 17 may, for example, be part of a column memory 50 structure. Through the use of address decoders 15 and 19, a row and column address is provided for each pixel. The CMOS imager 10 is operated by the control circuit 21, which controls address decoders 15, 19 for selecting the appropriate row and column lines for pixel readout, and row and column driver circuitry 13, 17, which apply driving voltage to the drive transistors of the selected row and column lines. The pixel array outputs a signal, $V_{sig}$, as an analog signal that is digitized by an analog-to-digital converter (ADC) 44. A column parallel ADC is used to convert analog signals received from a given pixel in a corresponding column to a digital value which may be stored in memory 50.

Figure 1B:
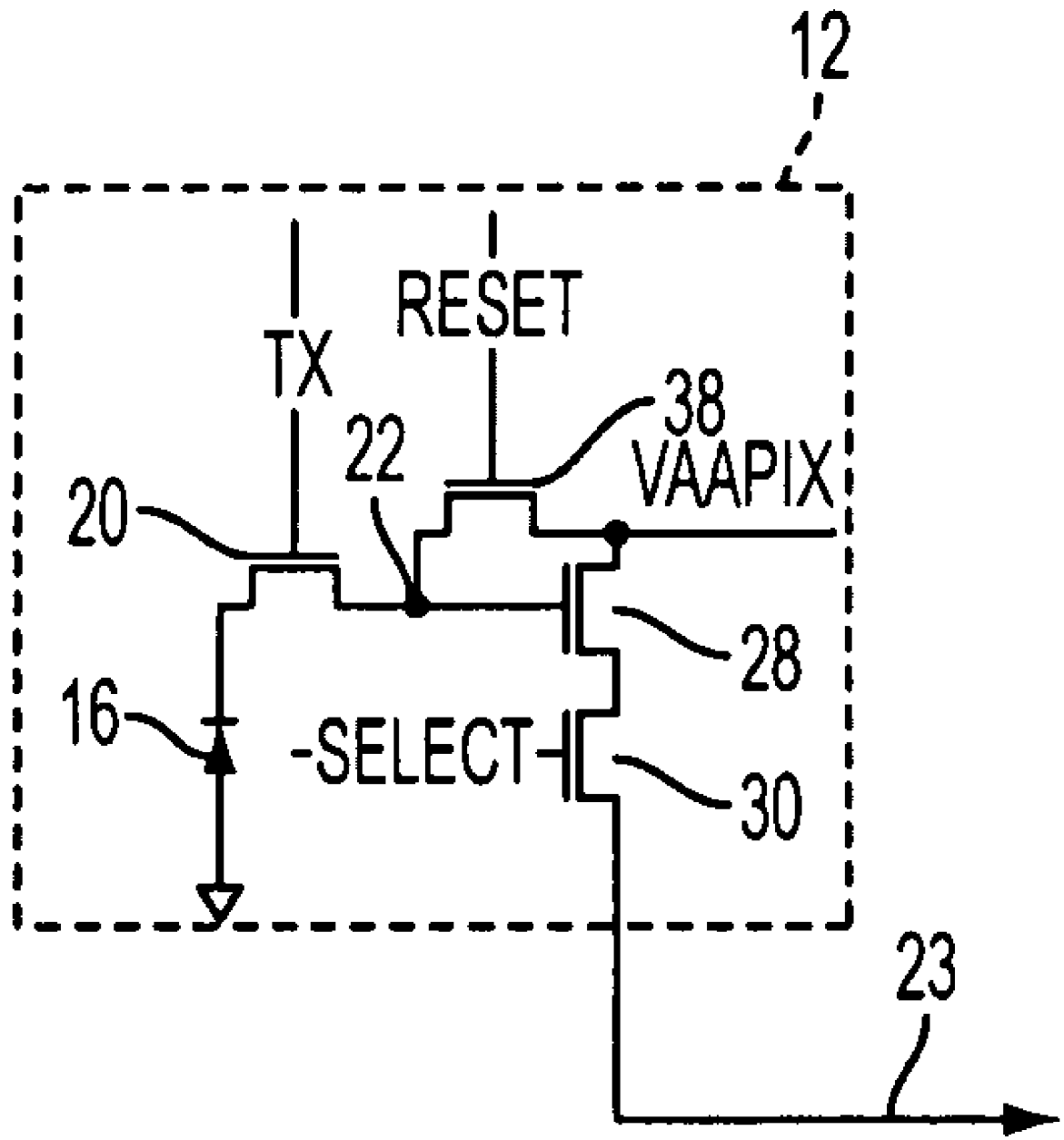
FIG. 1B is a schematic of a pixel cell in an image sensor that generates analog signals.

FIG. 1B shows a pixel cell 12 used in a CMOS imager such as the imager 10 illustrated in FIG. 1A. The pixel cell 12 includes a photosensor 16, floating diffusion node 22, transfer transistor 20, reset transistor 38, source follower transistor 28 and row select transistor 30. The photosensor 16 is shown as a photodiode, but other forms of photosensors may be used (for example a photogate, etc.). The photosensor 16 is connected to the floating diffusion node 22 by the transfer transistor 20 when the transfer transistor 20 is activated by a control signal TX. The reset transistor 38 is connected between the floating diffusion node 22 and an array pixel supply voltage $V_{AA\text{-}Pix}$. A reset control signal RESET is used to activate the reset transistor 38, which resets the floating diffusion node 22 to set it to $V_{rst}$ as is known in the art.

The source follower transistor 28 has its gate connected to the floating diffusion node 22 and is connected between pixel supply voltage $V_{AA\text{-}Pix}$ and the row select transistor 30. The source follower transistor 28 converts the stored charge at the floating diffusion node 22 into an electrical output voltage signal. The row select transistor 30 is controllable by a row select signal SELECT for selectively connecting the source follower transistor 28 and its output voltage signal to a column line 23 of a pixel array. It should be appreciated that the illustrated pixel 12 is an example of the type of pixel that may be used with the invention and that the invention is not limited to the type or configuration of the pixel 12.

In operation, the column voltage $V_{sig}$ for the pixel 12 is discharged to an analog-to-digital converter which digitizes this voltage. Preferably, the analog-to-digital converter adjusts $V_{sig}$ for errors and offsets to produce an adjusted input voltage $V_{in}$ prior to digitization (as described below with reference to FIGS. 7 and 8). $V_{in}$ is used to create a differential signal $V_{in\text{-}diff}$ that is used for digitization.

Figure 2A:
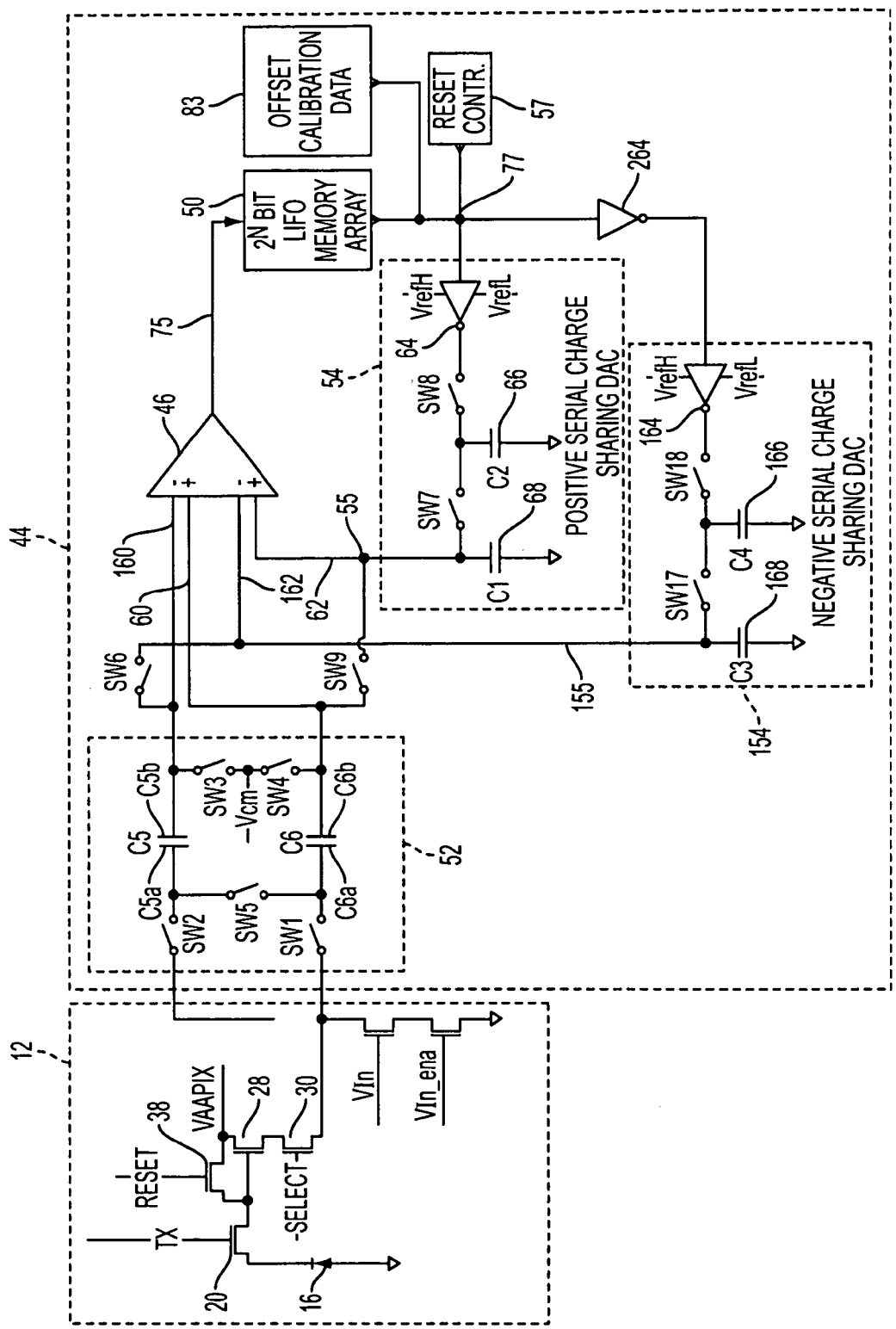
FIG. 2A is a schematic of an exemplary embodiment of a column in an image sensor having column parallel analog-to-digital converters.

An exemplary embodiment of an ADC 44 is shown in FIG. 2A. ADC 44 may be used to convert the analog signals, received from pixel cells 12, to digital signals. As shown in FIG. 2A, the ADC 44 includes a differential comparator 46, memory 50, "crow bar" circuit 52, offset calibration storage 83, and two DACs 54, 154. As shown in FIG. 2A, ADC 44 is coupled to an array of pixel cells 12 (for clarity purposes, only one cell 12 having a photosensor 16, transfer gate 20, reset gate 38, row select transistor 30 and source follower transistor 28 is shown). Preferably, each differential comparator 46 is a regenerative latch. Regenerative latches have the advantages of zero quiescent current, very high speed, and rail-to-rail outputs.

As further shown in FIG. 2A, crow bar circuit 52 may comprise a first crow bar capacitor C6 and a second crow bar capacitor C5. First crow bar capacitor C6 is coupled at one plate (C6a) via switch SW1 to pixel cell 12, and coupled at the other plate (C6b) via switch SW4 to common mode voltage $V_{cm}$. Plate C6b of first crow bar capacitor C6 is further coupled each to a positive input signal line 60, and to (via switch SW9) a first DAC 54. Second crow bar capacitor C5 is coupled at one plate (C5a) via switch SW2 to pixel cell 12, and coupled at the other plate (C5b) via switch SW3 to common mode voltage $V_{cm}$. Plate C5b of pixel output capacitor C5 is also coupled each to a negative input signal line 160, and to (via switch SW6) a second DAC 154. Crow bar circuit 52 may be used to apply an first analog voltage signal, $V_{in\text{-}pos}$, to the positive input signal line 60, and a second analog voltage signal $V_{in\text{-}neg}$, to the negative input signal line 160. The differential, $V_{in\text{-}diff}$, between $V_{in\text{-}pos}$ at line 60 and $V_{in\text{-}neg}$ at line 160 (e.g., $V_{in\text{-}diff}=|V_{in\text{-}pos}-V_{in\text{-}neg}|$) corresponds to the signal incident on pixels 12 and is used by the differential comparator 46 in order to produce digital values corresponding to the bits of the N-bit series being generated.

As shown in FIG. 2A, there is a second pair of input lines including a positive feedback line 62, and a negative feedback line 162 to differential comparator 46. Positive feedback line 62 couples a first DAC output line 55 to differential comparator 46 such that analog output values from first DAC 54 may be applied as an input to differential comparator 46. Negative feedback line 162 couples a second DAC output line 155 to differential comparator 46 such that analog output values from second DAC 154 may be applied as an input to differential comparator 46. Differential comparator 46 determines the differential, $V_{DAC\text{-}diff}$, between the analog voltage values applied at positive feedback line 62 and negative feedback line 162, and compares this differential to the differential at positive input signal line 60 and negative input signal line 160 (i.e., $V_{in\text{-}diff}$) to produce digital values corresponding to the bits in the N-bit series being generated. For example, differential comparator 46 may be configured such that if $V_{in\text{-}diff}$ is greater than $V_{DAC\text{-}diff}$, then differential comparator 46 outputs a logic high, and if $V_{in\text{-}diff}$ is not greater than $V_{DAC\text{-}diff}$, then differential comparator 46 outputs a logic low. Alternative configurations for differential comparator 46 are acceptable (e.g., a logic low may be output if $V_{in\text{-}diff}$ is greater than $V_{DAC\text{-}diff}$, and a logic high output if $V_{in\text{-}diff}$ is not greater than $V_{DAC\text{-}diff}$).

Figure 2B:
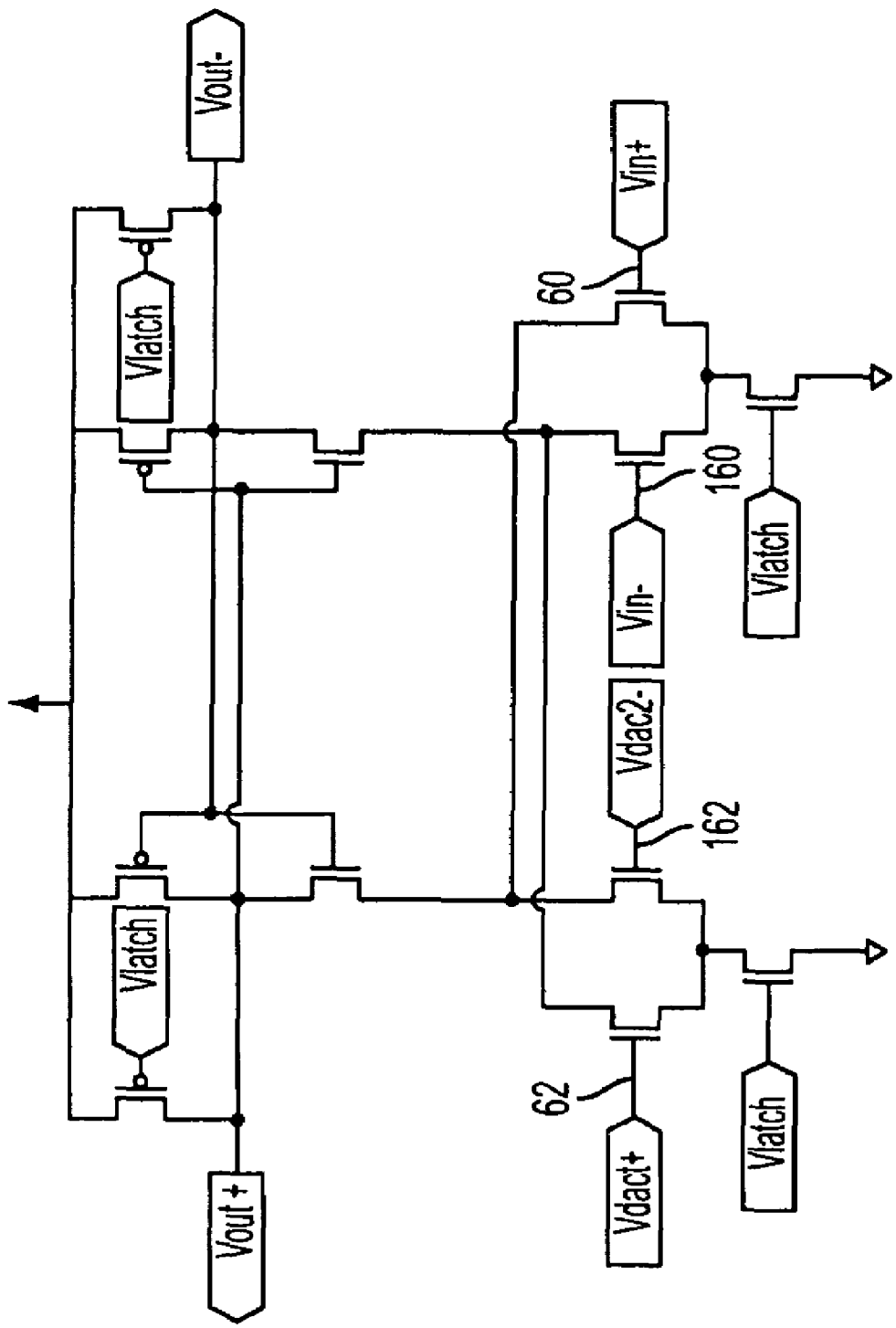
FIG. 2B is a schematic of an exemplary embodiment of a differential comparator of the ADC of FIG. 2A in the form of a fully differential regenerative comparator.

Preferably, differential comparator 46 is a fully differential regenerative comparator (also called a regenerative latch). An exemplary embodiment of such a regenerative latch is illustrated in FIG. 2B. As shown in FIG. 2B, the differential signal, $V_{in\text{-}diff}$ (corresponding to the incoming voltage signal that is being digitized) comprises $V_{in\text{-}pos}$ and $V_{in\text{-}neg}$ applied at positive input signal line 60 and negative input signal line 160, respectively. As further shown in FIG. 2B, the differential $V_{DAC\text{-}diff}$ comprises the voltages at the outputs of first DAC 54 applied at positive feedback line 62 and second DAC 154 applied at negative feedback line 162.

Referring to FIG. 2A, an output line 75 couples differential comparator 46 to memory 50. Preferably memory 50 comprises a memory array for storing bit values during the digitization of analog signals by ADC 44. An offset calibration storage 83 (e.g., RAM, EPROM, antifuse or other types of programmable storage) is also provided for storing data used to calibrate ADC 44 (e.g., to adjust for offset errors in differential comparator 46).

According to the exemplary embodiment of FIG. 2A, memory 50 is also coupled to first DAC 54, and (via inverter 264) to second DAC 154. First DAC 54 comprises a first reference selector 64, a first capacitor 66 and a second capacitor 68. Preferably capacitors 66, 68 are matched capacitors. Switch SW8 couples first reference selector 64 to first capacitor 66. Switches SW8 and SW7 couple first reference selector 64 to second capacitor 68 and first DAC output line 55. Switch SW7 further couples first capacitor 66 to second capacitor 68 and to first DAC output line 55.

As farther shown in FIG. 2A, second DAC 154 is configured similarly to first DAC 54, and both DACs 54, 154 receive input from memory 50. However, as also shown in FIG. 2A, inverter 264 inverts the input that second DAC 154 receives from memory 50 (relative to the input received by first DAC 54). As further shown in FIG. 2A, second DAC 154 comprises a second reference selector 164, a third capacitor 166 and a fourth capacitor 168 (preferably matched capacitors). Switch SW18 couples second reference selector 164 to third capacitor 166. Switches SW18 and SW17 couple second reference selector 164 to forth capacitor 168 and second DAC output line 155. Switch SW17 further couples third capacitor 166 to fourth capacitor 168 and to second DAC output line 155.

Preferably, as shown in FIG. 2A, an input of each first reference selector 64 and second reference selector 164 (via inverter 264) is respectively coupled to a node 77 for receiving command signals from a reset control block 57.

First DAC 54 of the exemplary embodiment outputs an analog voltage on first DAC output line 55 that is determined by the digital bit value that is input to first reference selector 64. The first DAC 54 output voltage is applied via first DAC output line 55 to positive feedback line 62 of differential comparator 46.

Similarly, second DAC 154 of the exemplary embodiment outputs an analog voltage on second DAC output line 155 that is determined by the digital bit value that is input to the DAC reference selector 164. The second DAC 154 output voltage is applied via feedback output line 155 to negative feedback line 162 of differential comparator 46.

During a compare mode of differential comparator 46, the DAC differential, $V_{DAC\text{-}diff}$, at the first DAC 54 output (applied at positive feedback line 62) and the second DAC 154 output (applied at negative feedback line 162) is compared to the differential at first positive input line 60 and first negative input line 160 (i.e., $V_{in\text{-}diff}$). $V_{in\text{-}diff}$ corresponds to $V_{in}$, which corresponds to the analog voltage from pixel cells 12 ($V_{sig}$) preferably including adjustments that have been made for errors or offsets. As a result of comparing the voltages $V_{DAC\text{-}diff}$ and $V_{in\text{-}diff}$, differential comparator 46 generates a digital value, and a corresponding value is stored in memory 50 as $bit_i$ of an N-bit digital series.

The ADC 44 of FIG. 2A may be fabricated according to conventional semiconductor fabrication processes (e.g., mask-based/lithography or other fabrication processes known in the art). The ADC 44 may be fabricated on a chip comprising the circuitry for generating the analog voltages that are supplied to ADC 44, such as for example on an imager chip.

Figure 3A:
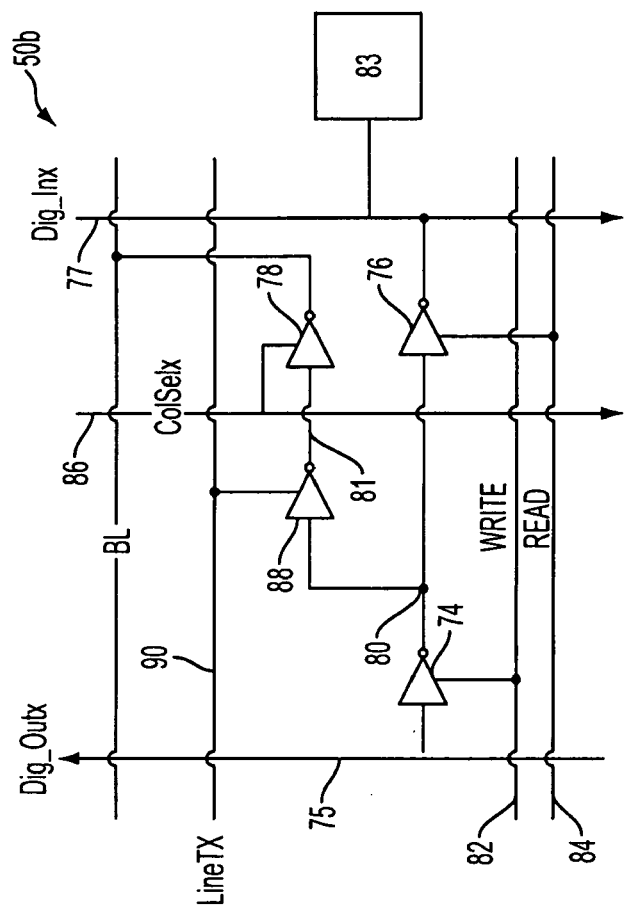
FIG. 3A is a schematic of an exemplary embodiment of the memory of the image sensor of FIG. 2A.

FIG. 3a illustrates an exemplary embodiment of a memory 50a that can be used as memory 50 (FIG. 2A) for storing digital bit values generated by the ADC 44 of FIG. 2A. Memory 50a comprises a RAM cell 72 including three tri-state inverters, 74, 76, 78. First tri-state inverter 74 receives a digital bit value from ADC 44 via differential comparator output line 75. First tri-state inverter 74 is also coupled to a write command signal line 82. Upon receiving a write command via write command signal line 82, first tri-state inverter 74 inverts the digital bit value received from ADC 44 and outputs it to store node 80. Store node 80 is coupled to the inputs of the second tri-state inverter 76 and the third tri-state inverter 78.

Second tri-state inverter 76 is also coupled to a read command signal line 84. Upon receiving a read command on line 84, second tri-state inverter 76 inverts the digital bit value stored at store node 80, and outputs the inverted value to digital input line 77, which is the input line to each first DAC reference selector 64 (FIG. 2A) and inverter 264 (FIG. 2A). In this way, the digital bit value received from ADC 44 by first tri-state inverter 74 is input to each first DAC 54 (via first reference selector 64) and second DAC 154 (via inverter 264 and second DAC reference selector 164).

Third tri-state inverter 78 is coupled to a column select command line 86. Upon receiving a column select signal on line 86, third tri-state inverter 78 inverts the digital bit value stored at store node 80 and drives this inverted value onto the bit line bus BL. In this way, a series of bit values may be read out of ADC 44 (FIG. 2A) successively during line readout.

Figure 3B:
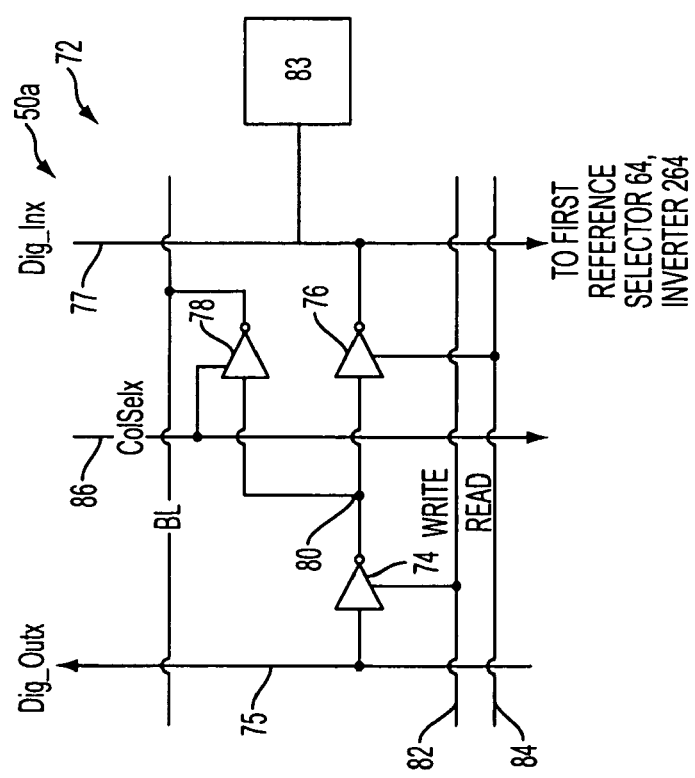
FIG. 3B is a schematic of an alternative exemplary embodiment of the memory of the image sensor of FIG. 2A.

FIG. 3b illustrates a memory 50b that can be used as memory 50 (FIG. 2A). As shown in FIG. 3b, a fourth tri-state inverter 88 is coupled between store node 80 and third tri-state inverter 78. Fourth tri-state inverter 88 is also coupled to a transfer control line 90. Between bit line readout operations (e.g., between column select commands), a line transfer control signal may be used to cause fourth tri-state inverter 88 to invert the digital bit value stored at store node 80 and transfer the value to a second store node 81 in response to a signal from transfer control line 90. In this way, a value used in the current ADC conversion for a given pixel row can be stored at store node 80, while a value corresponding to the ADC conversion of the preceding pixel row can be simultaneously stored at second store node 81 for readout. Because memory 50b uses three tri-state inverters (i.e., tri-state inverters 74, 88, and 78) to buffer a bit value received on line 75, the bit values readout to bit line BL are inverted from those received via line 75.

Figure 14A:
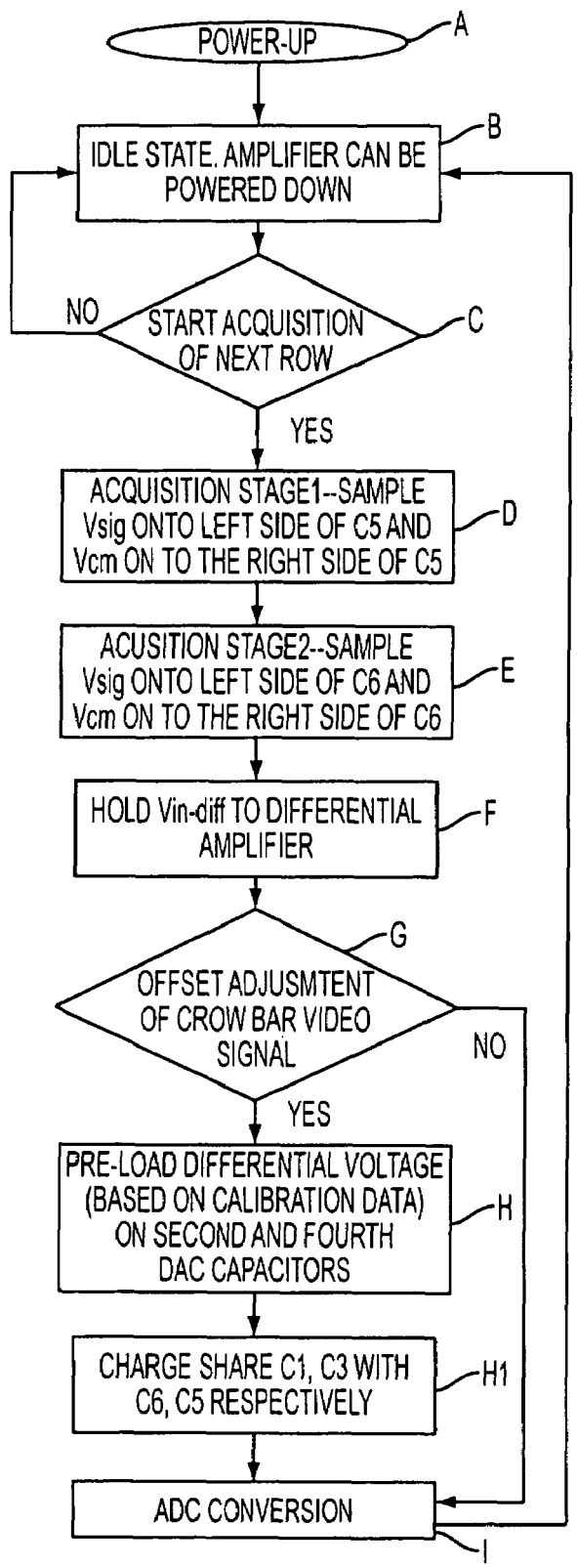
FIG. 14A is a flowchart of top level states of an exemplary embodiment of common mode voltage adjustment and successive approximation during the exemplary method of FIGS. 4-13.

FIG. 14A illustrates top-level states of an exemplary method of Common Mode Voltage Adjustment and successive approximation performed using an exemplary image sensor having an ADC of FIG. 2A. As illustrated in FIG. 14A (at steps A-C), upon power up of the system (e.g., the image sensor), an ADC 44 for successive approximation may remain in the idle state with differential comparator 46 (FIG. 2A) powered down until beginning acquisition of analog signals from a row of pixel cells 12 (FIG. 2A). A differential comparator in the form of a regenerative latch (e.g., as shown in FIG. 2B) does not have any quiescent current and does not need to be powered-down conventionally.

Figure 4:
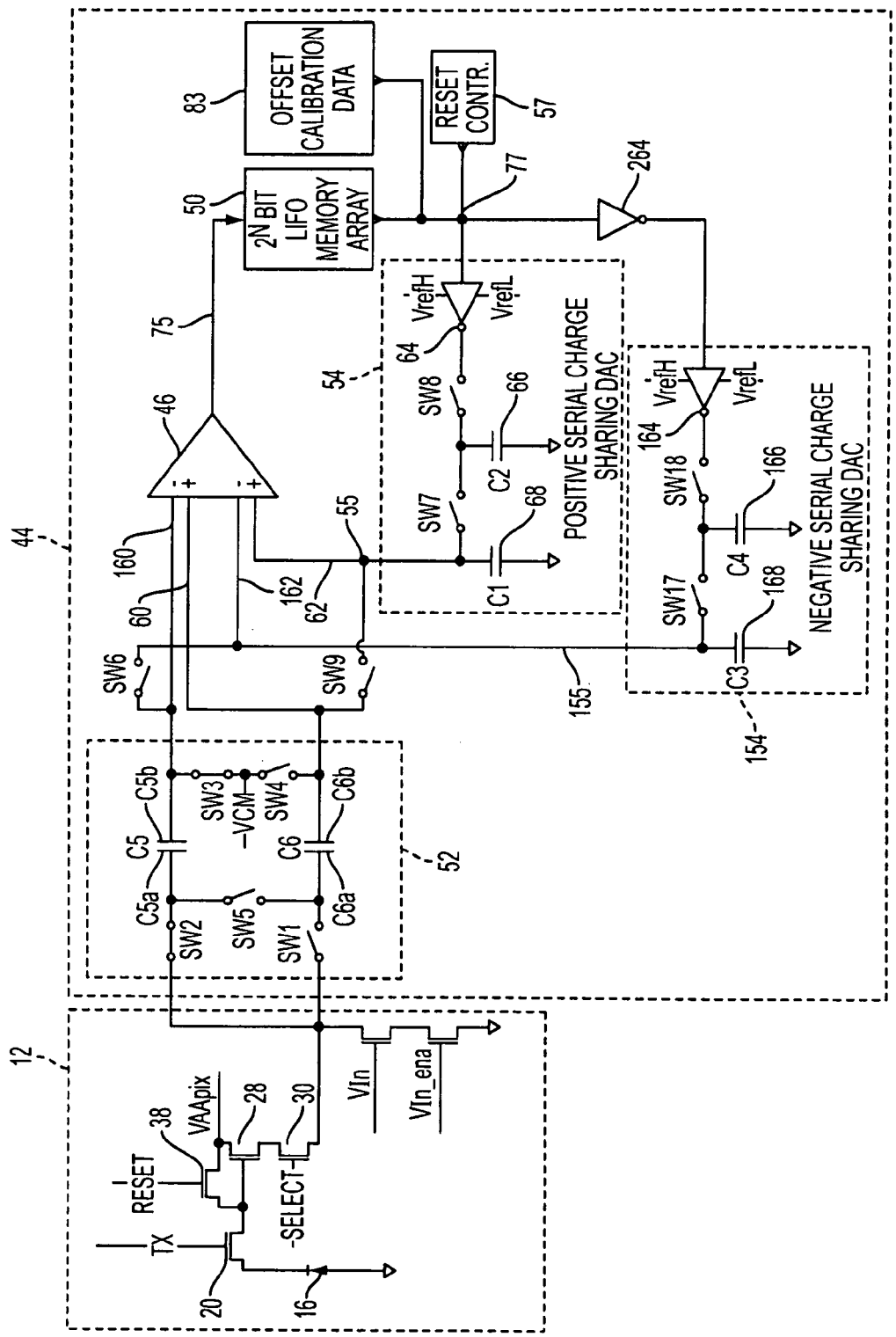
FIG. 4 is a schematic of an exemplary embodiment of the image sensor of FIG. 2A during an exemplary common mode adjustment method having an application of a pixel array output signal and a voltage common mode signal to a crow bar circuit.

As shown in FIG. 14A at step D and FIG. 4, when beginning the acquisition of analog signals, the pixel reset signal ($V_{rst}$) is sampled on to the left side of second crow bar capacitor C5 (i.e., on to C5a) and a common mode voltage reference ($V_{cm}$) is sampled (via switch SW3) on to the right side of second crow bar capacitor C5 (i.e., on to C5b).

Figure 5:
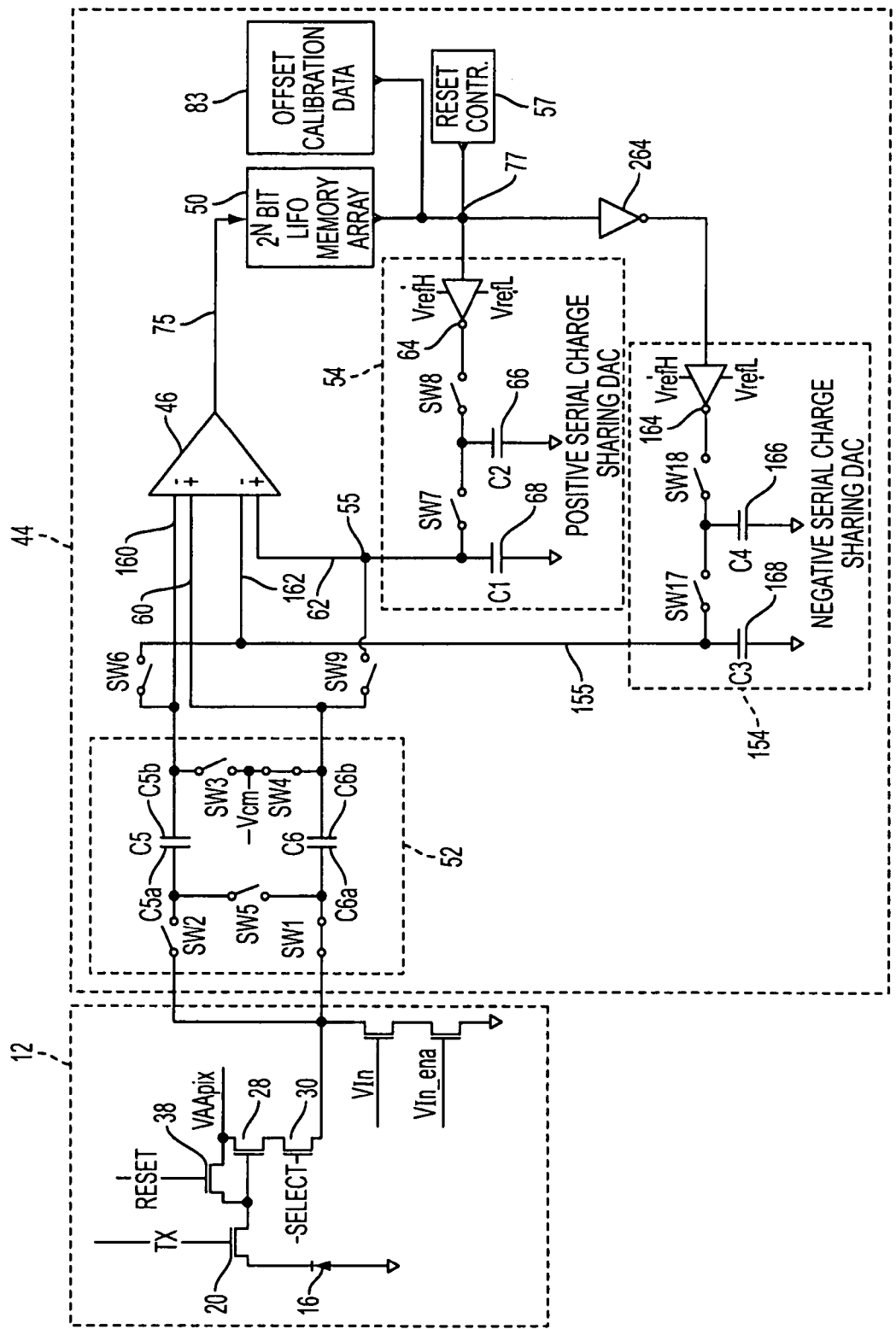
FIG. 5 is a schematic of an exemplary embodiment of the image sensor of FIG. 2A during an exemplary common mode adjustment method having another application of a pixel array output signal and a voltage common mode signal to a crow bar circuit.

Next, as shown in FIG. 14A at step E (and further described below with reference to FIG. 5), $V_{sig}$ is sampled on to the left side of first crow bar capacitor C6 (i.e., on to C6a) and a common mode voltage reference ($V_{cm}$) is sampled (via switch SW4) on to the right side of first crow bar capacitor C6 (i.e., on to C6b).

By altering the column-wide common mode voltage Vcm between step D and step E, a common offset shift can be performed on all pixels within that row.

Figure 6:
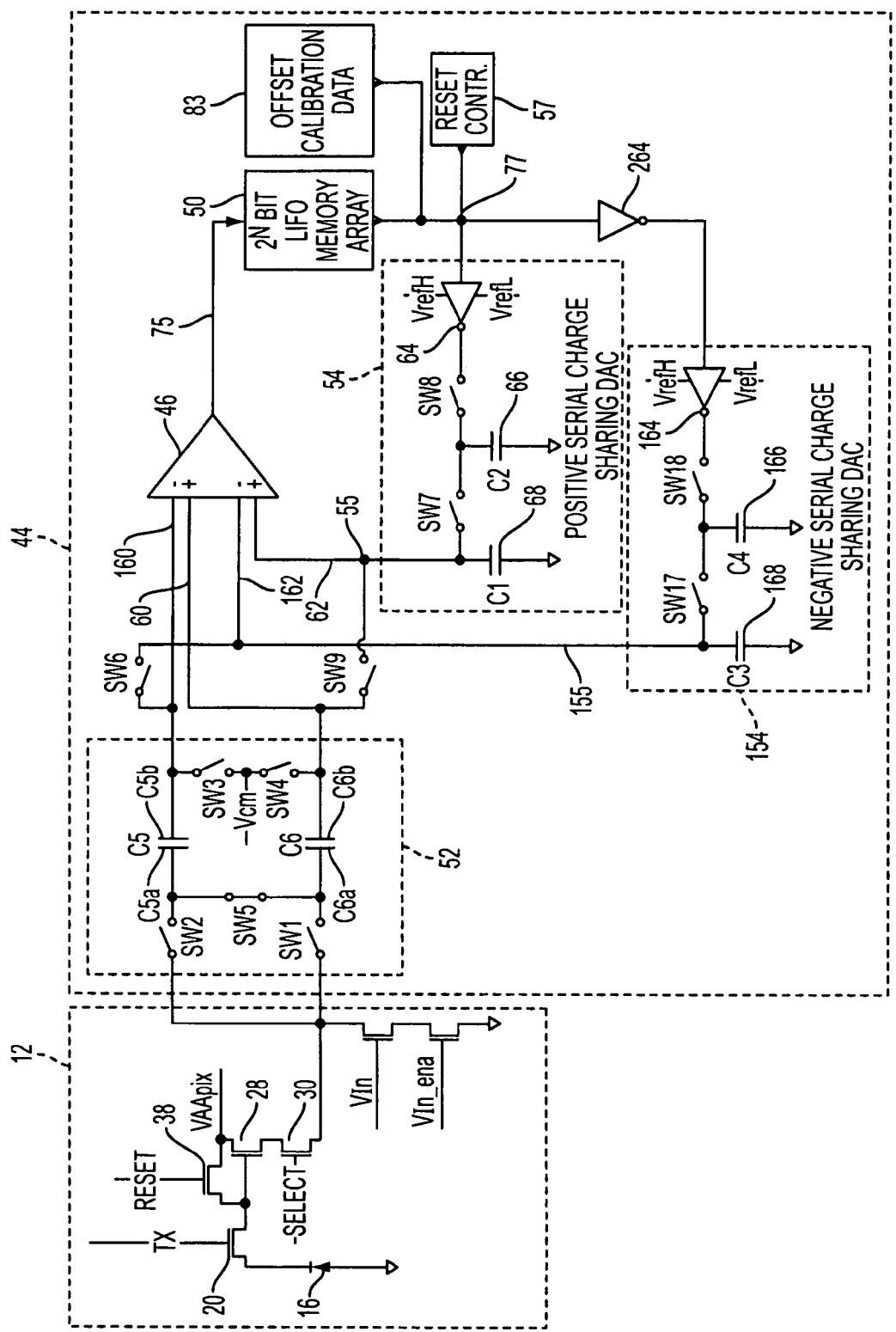
FIG. 6 is a schematic of an exemplary embodiment of the image sensor of FIG. 2A during an exemplary method of generating a bit in an N-bit series having a differential input signal applied to a differential comparator.

As further shown in FIG. 14A at step F, and with reference to FIG. 6, $V_{in\text{-}diff}$ (the differential of the incoming signals stored on crow bar capacitors C5, C6) is continuously held to the differential comparator 46 (i.e., held across positive input signal line 60 and negative input signal line 160) by closing switch SW5, opening switched SW2 and SW3 (for second crow bar capacitor C5), and opening switches SW1 and SW4 (for first crow bar capacitor C6). Ideally, the differential input signal is centered around $V_{cm}$. For example, ADC 44 may be configured so that the signal at positive input signal line 60 is $$|V_{in}/2+V_{cm}|, \text{ where Vin=Vrst-Vsig} \quad (1)$$

and the signal at negative input signal line 160 is $$|V_{in}/2-V_{cm}| \quad (2)$$

where $V_{cm}$ is greater than $V_{in}$; and as a result, $V_{in\text{-}diff}$ is $+/-V_{in}/2$ away from $V_{cm}$ (i.e., is centered around $V_{cm}$).

Preferably, an offset adjustment is made to crow bar circuit 52 in order to adjust $V_{in\text{-}diff}$ and thereby compensate for offset errors in differential comparator 46. In this way, this embodiment of the invention avoids the need to provide differential comparator offset nulling schemes. As shown in FIG. 14A, at steps G and H, if an offset adjustment is to be made (FIG. 14A, step G) then, as shown in step H, a differential voltage is pre-loaded on to first capacitors C1 (of first DAC 54) and third capacitor C3 (of second DAC 154).

Figure 7:
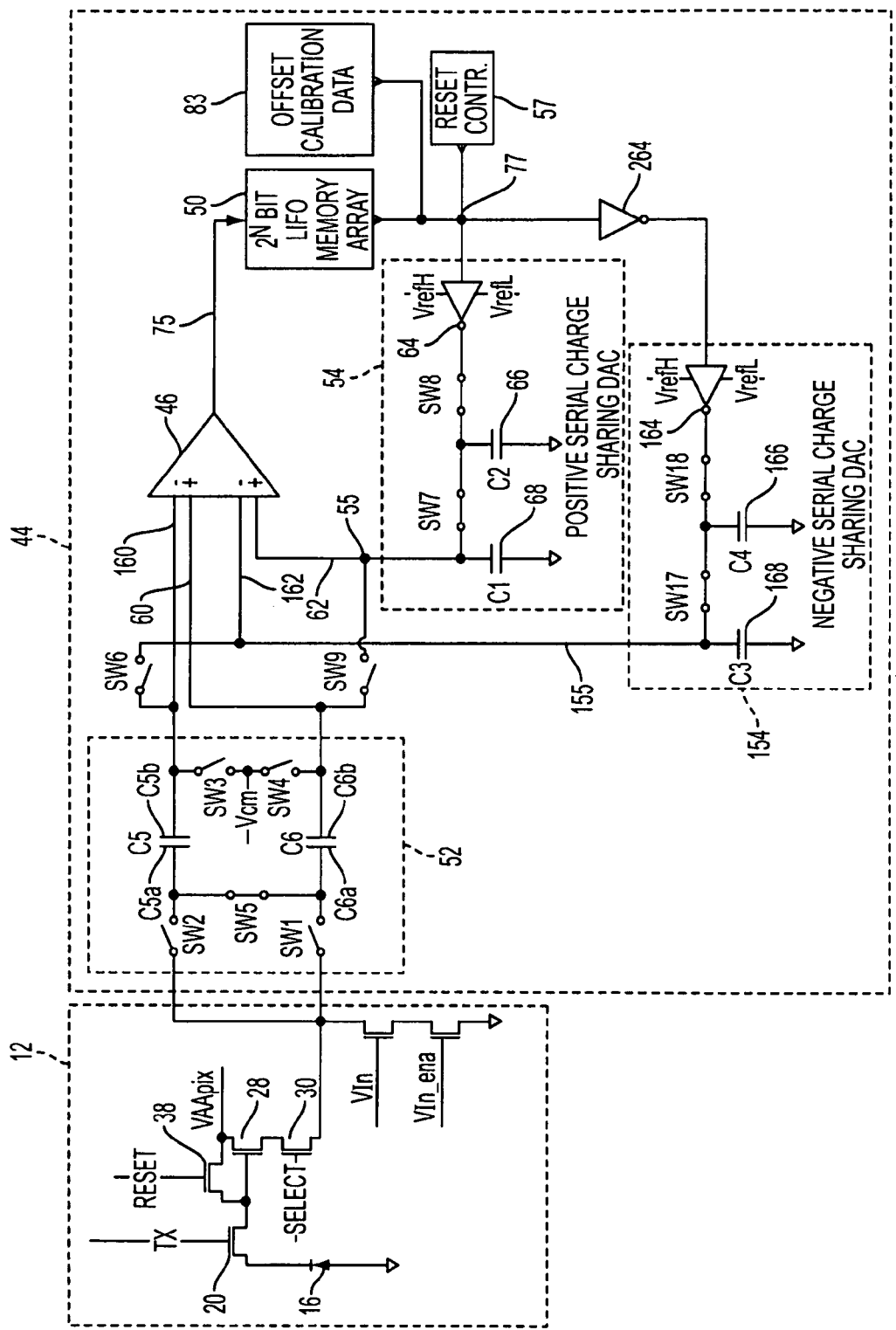
FIG. 7 is a schematic of an exemplary embodiment of the image sensor of FIG. 2A during an exemplary method of generating a bit in an N-bit series having offset adjustment data applied to a digital-to-analog converter.
Figure 8:
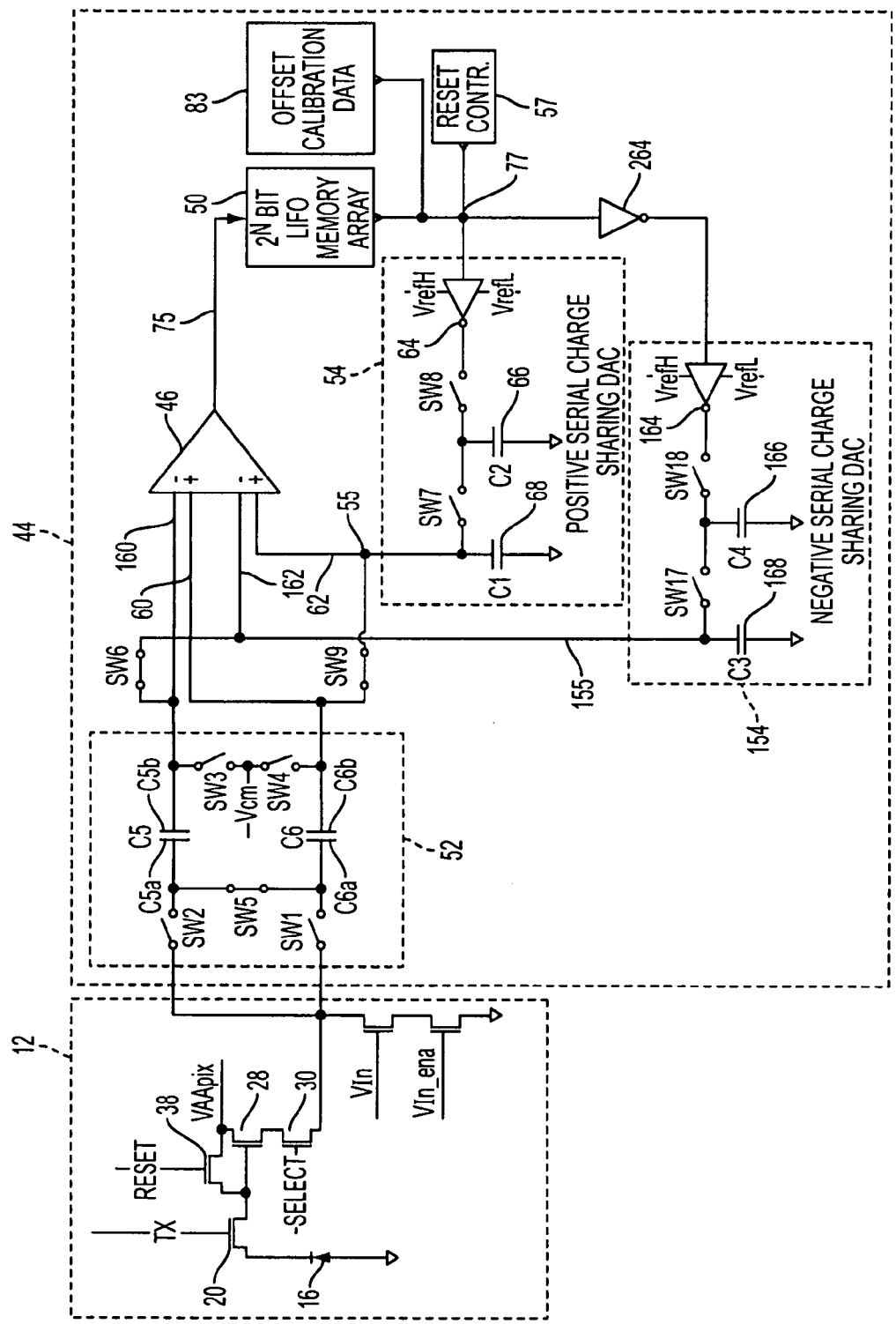
FIG. 8 is a schematic of an exemplary embodiment of the image sensor of FIG. 2A during an alternative exemplary method of generating a bit in an N-bit series having offset adjustment data applied to a crow bar circuit.

FIG. 7 illustrates an Offset-data Loading state using the ADC of FIG. 2A, and FIG. 8 illustrates a Charge-Sharing Controlled Shift state using the ADC of FIG. 2A. The Offset-data Loading and Charge-Sharing Controlled Shift states are performed to pre-load the differential voltage on to second capacitor 68 and fourth capacitor 168 as illustrated in FIG. 14A, steps H and H1.

As illustrated in FIG. 7, the DAC First Capacitor Reset Phase, calibration data is output from offset calibration storage 83. (The First Capacitor Reset Phase is performed in a manner similar to that describe with respect to FIG. 9, but uses calibration data). The calibration data is input to first DAC 54 via first reference selector 64, which performs a buffer function and outputs the calibration data to first capacitor 66 (via switch SW8) and second capacitor 68 (via switch SW7).

As also illustrated in FIG. 7, the calibration data output from offset calibration storage 83 is also input to inverter 264 which outputs an inverted signal to second reference selector 164 of the second DAC 154. Second reference selector 164 performs a buffer function and outputs the inverted calibration data to third capacitor 166 (via switch SW18) and fourth capacitor 168 (via switch SW17).

An offset calibration voltage is loaded onto differential DAC 54 and 154 similarly to DAC guess generation procedure outlined in FIG. 14C with reference to FIG. 9-13 as described later. The difference being to load the DAC bits 77 in FIG. 14C step D from offset calibration storage 83 rather than ADC conversion memory and FindPtr being initialized 0. This procedure will result in a voltage on DAC output voltages 62 and 162 determined solely by the bit contents of offset calibration storage 83.

Offset calibration storage 83 can preferably be less than N bits to store the offset error for each column using less die area. Also, offset calibration storage 83 is preferably configured by an image processor block (not shown) based on a column-offset detection algorithm as known in the art.

Because first DAC 54 and second DAC 154 are similarly configured, applying a non-inverted calibration data signals to one DAC (e.g., first DAC 54), and an inverted calibration data signal to the other DAC (e.g., second DAC 154) causes the signal that appears at the output of one DAC to be inverted relative to the other DAC.

FIG. 8 illustrates the Charge-Sharing Controlled Shift state of the ADC of FIG. 2A. As shown in FIG. 8, first DAC output line 55 is coupled to first crow bar capacitor C6 via switch SW9, and second DAC output line 155 is coupled to second crow bar capacitor C5 via switch SW6. During the Charge-Sharing Control Shift state, switch SW9 is closed and switch SW7 is open and the voltage at the output of first DAC 54, $V_{DAC1}$, (e.g., the voltage stored on second capacitor 68) is charge shared with the voltage on first crow bar capacitor C6, such that the charge shared voltage at first crow bar capacitor C6 is a ratio of the sum of the voltages on the charge shared capacitors:

$$\frac{C6 \cdot V_{C6} + C1 \cdot V_{DAC1}}{C6 + C1} \quad (3)$$

Similarly, switch SW6 is closed and switch SW17 is open and the voltage at the output of second DAC 154 (i.e., $V_{DAC2}$, the voltage stored on fourth capacitor 168) is charge shared with the voltage on second crow bar capacitor C5 such that the charge shared voltage at second crow bar capacitor C5 is a ratio of the sum of the voltages on the charge shared capacitors:

$$\frac{C5 \cdot V_{C5} + C3 \cdot V_{DAC2}}{C5 + C3} \quad (4)$$

In this way a differential voltage corresponding to the offset calibration data is pre-loaded on to crow bar capacitors C5, C6. The stored values on crow bar capacitors C5, C6 are used to generate the differential input voltage, $V_{in\text{-}diff}$ applied to differential comparator 46. Thus, the Charge-Sharing Controlled Shift state causes a controlled shift in $V_{in\text{-}diff}$ and compensates for offsets in differential comparator 46 as well as reducing the input swing on comparator 46 to match the comparator's input common mode range.

As illustrated in FIG. 8, $V_{in\text{-}diff}$ may be adjusted for offsets by applying offset calibration data to crow bar capacitors C5, C6 while switches SW3 and SW4 are open and SW5 is closed. In this way the offset calibration data is applied to second crow bar capacitor C5 via switch SW6, and to first crow bar capacitor C6 via switch SW 7 while both crow bar capacitors C5, C6 are disconnected from the voltage common mode reference source, $V_{cm}$. This configuration calibrates out offset errors in the ADC, without substantially reducing the differential signal, $V_{in\text{-}diff}$, that is applied to differential comparator 46.

As illustrated in FIG. 14A step I (and further described below with reference to FIGS. 9-13), after $V_{in\text{-}diff}$ is applied to differential comparator 46, the ADC conversion to digital values occurs.

Figure 14B:
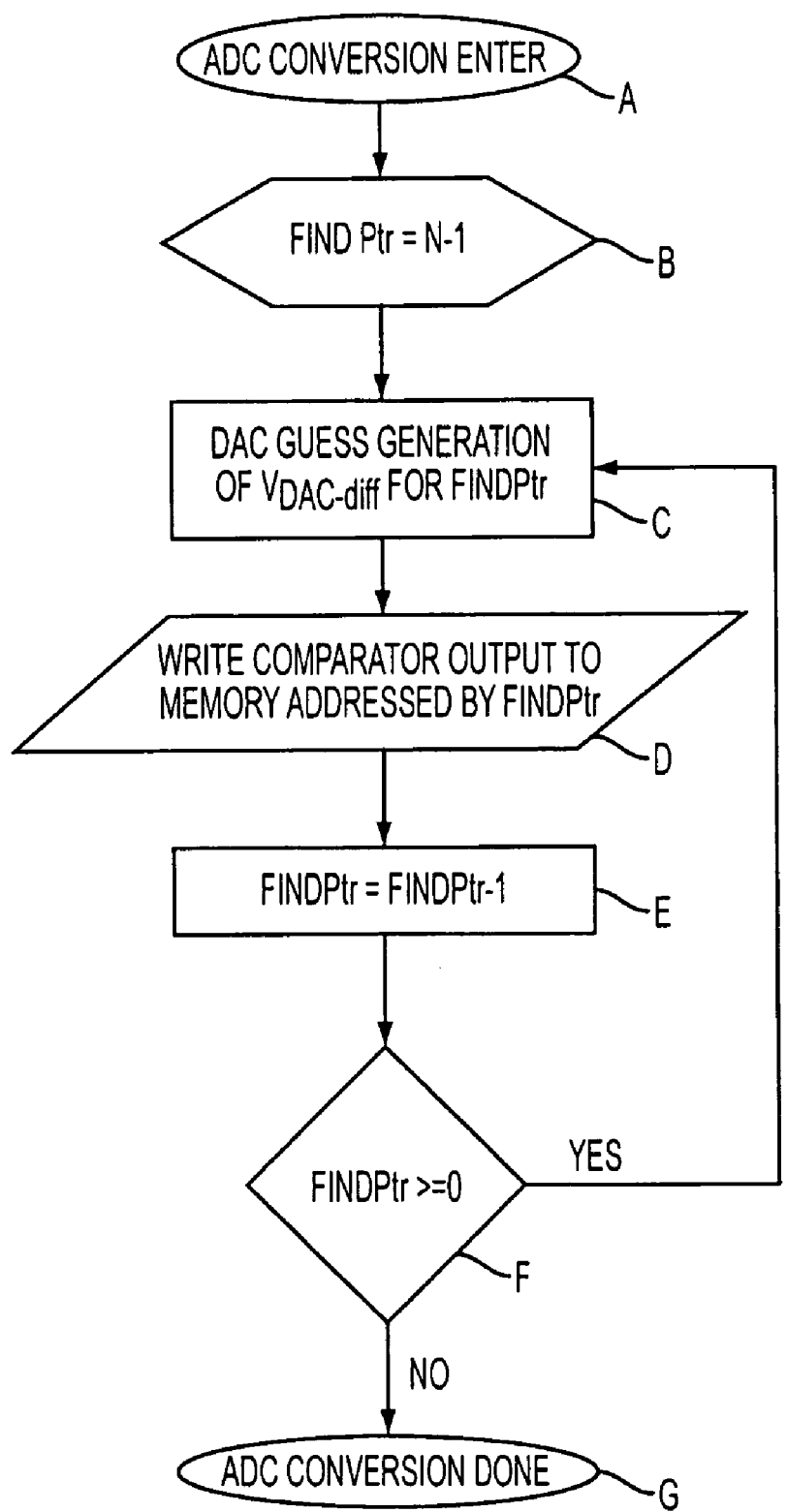
FIG. 14B is a flowchart of top level states of an exemplary embodiment of successive approximation during the exemplary method of FIGS. 9-13.

An exemplary top level flow for ADC conversion is shown in FIG. 14B for converting an analog signal to N bits ranging from N−1 (the MSB) to 0 (the LSB). After entering the ADC conversion process (step A in FIG. 14B), a pointer (i.e., FindPtr) may be used to designate a given bit, during the ADC conversion process. As shown at step B, the process begins with the pointer set to N−1 (i.e., the most significant bit). Next, as shown at step C, a DAC guess generation is performed for generating a differential DAC analog value, $V_{DAC\text{-}diffi}$, where i=FindPtr. $V_{DAC\text{-}diffi}$ is the DAC differential (i.e. the differential feedback signal) applied to differential comparator 46 at positive feedback line 62 and negative feedback line 162. $V_{DAC\text{-}diffi}$ is compared to differential input signal, $V_{in\text{-}diff}$ (which corresponds to pixel video signal). Based on the comparison of $V_{DAC\text{-}diffi=N-1}$ and $V_{in\text{-}diff}$, ADC 44 generates the bit designated by the pointer (e.g., $bit_{N-1}$ for FindPtr=N−1).

Next, as shown in step D of FIG. 14B, the bit value resulting from the DAC guess generation (also illustrated in the flow of FIG. 14C), is written to a memory location having an address corresponding to the pointer (i.e., corresponding to FindPtr). Next, the pointer value is decremented (as shown in step E), and if the decremented pointer value is at or above a minimum value (e.g., if FindPtr>=0) as shown in step F, then steps C-E are repeated. Thus, for example, after decrementing FindPtr from N−1 to N−2, the DAC guess generation process is performed to generate an analog differential value, $V_{DAC\text{-}diffi=N-2}$ that is compared to $V_{in\text{-}diff}$, for generation of a digital value (step C) that is written to memory 50 (step D) and corresponds to the second most significant bit (i.e., $bit_{i=N-2}$)

of the N-bit series. FindPtr is decremented from N−2 to N−3 (step E), which is greater than the minimum value of 0 (for FindPtr corresponding to N−1 through 0 (step F)), and steps C-E are repeated to determine $bit_{i=N-3}$. When the pointer value is not at or above the minimum value, this indicates that all N-bits have been generated (e.g., bit values corresponding to FindPtr=N−1 through 0 have been generated), then as shown in steps F and G, the ADC conversion process is complete.

An exemplary embodiment of a method of using ADC 44 of FIG. 2A to reset first DAC 54 and second DAC 154, and to generate the MSB of an N-bit digital series corresponding to differential input signal, $V_{in-diff}$ (applied at positive input signal line 60 and positive input signal line 160), is now described with reference to FIGS. 9-11.

Figure 9:
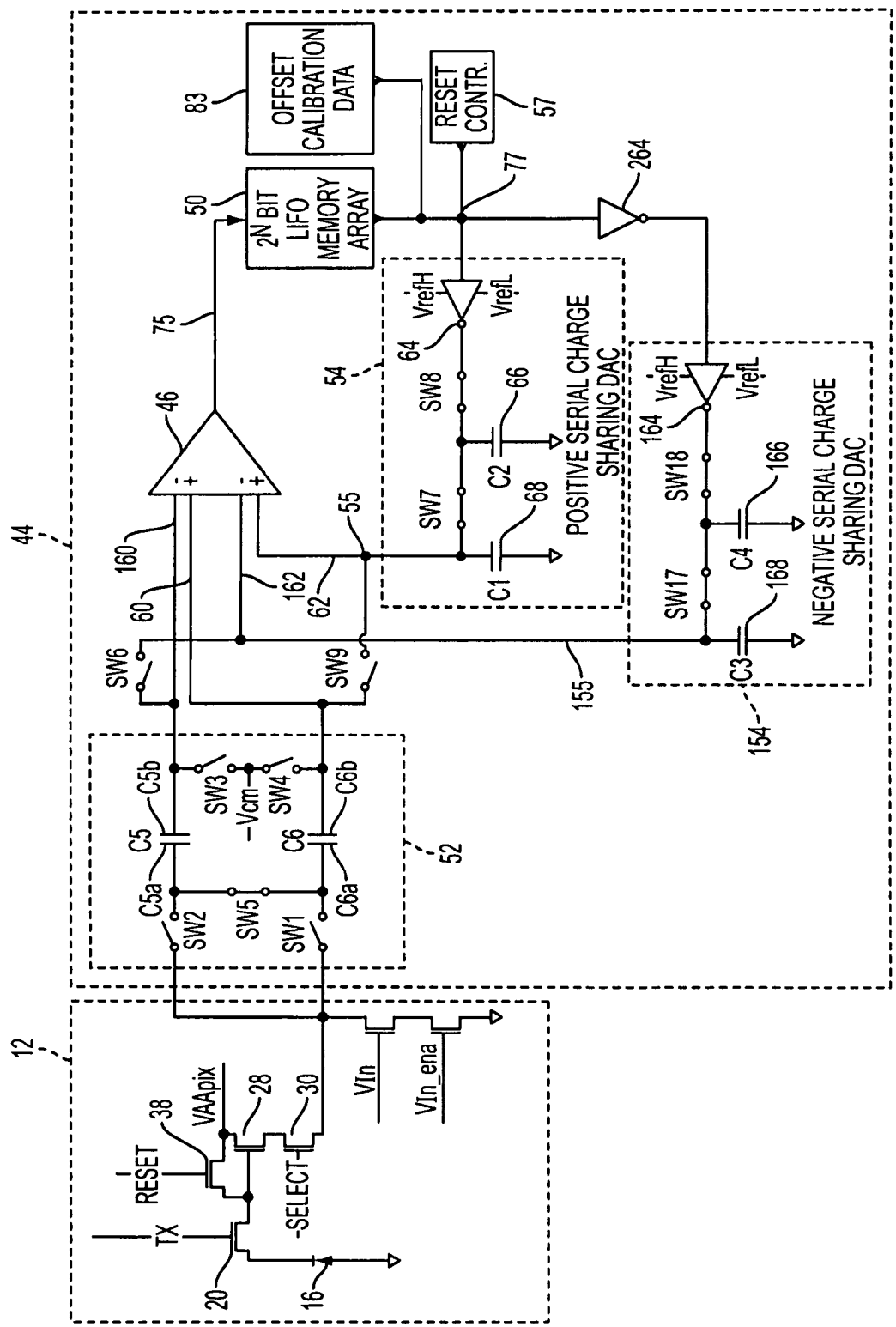
FIG. 9 is a schematic of an exemplary embodiment of the image sensor of FIG. 2A during an exemplary method of generating a bit in an N-bit series having an application of reference voltages to digital-to-analog converters.
Figure 10:
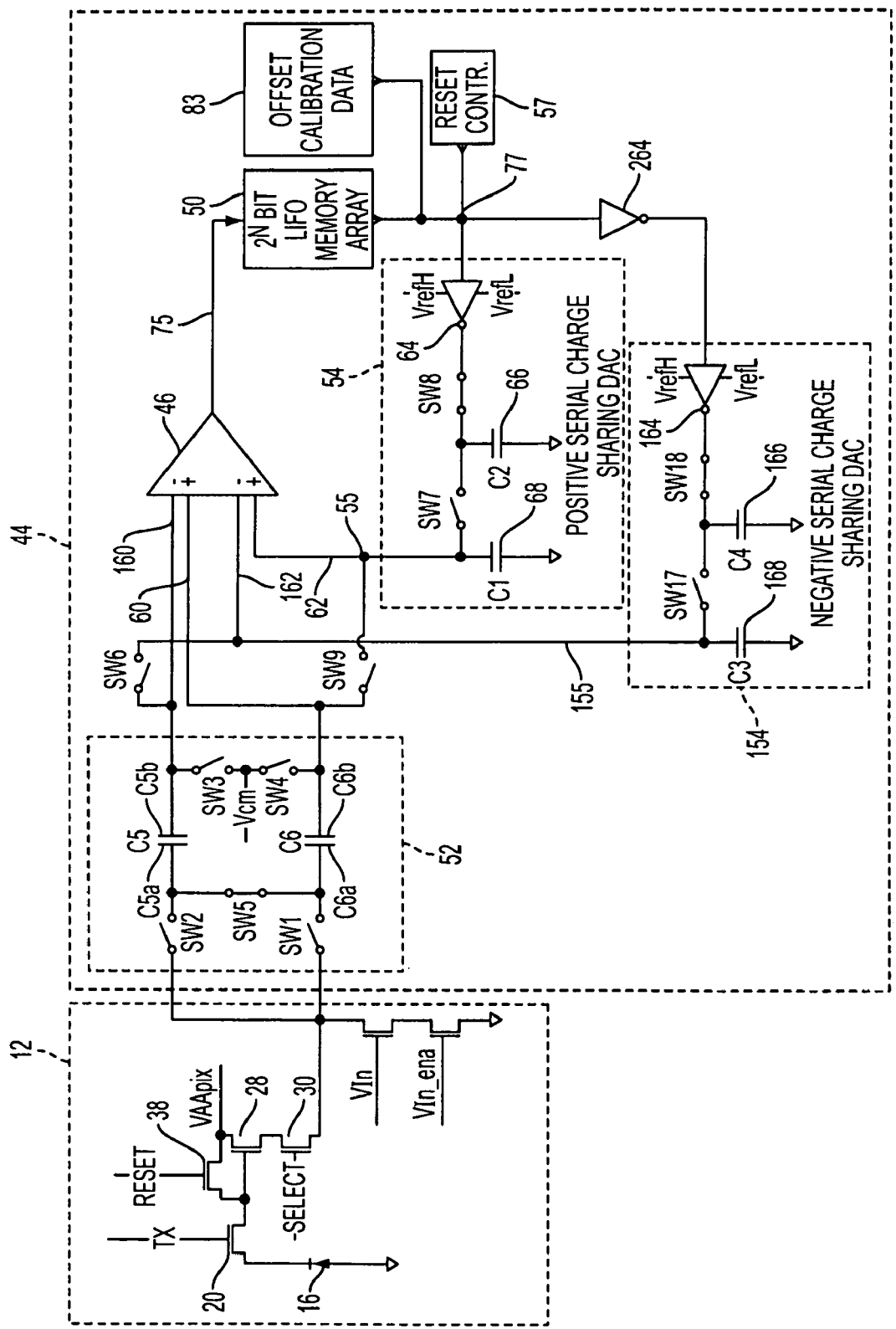
FIG. 10 is a schematic of an exemplary embodiment of the image sensor of FIG. 2A during an exemplary method of generating a bit in an N-bit series having another application of reference voltages to digital-to-analog converters.

A First Capacitor Reset state is illustrated in FIG. 9. During the First Capacitor Reset state, first DAC 54 and second DAC 154 each go through reset mode as follows. A control signal is applied to node 77 and is input to first reference selector 64 of first DAC 54. Depending on the control signal, reference selector 64 outputs either a high reference voltage $V_{refH}$ or $V_{refL}$. For example, first reference selector 64 may be configured to output $V_{refH}$ in response to a first control signal, and output $V_{refL}$ in response to a second control signal. For example, as shown in FIG. 9, a reset control block 57 may be used to force control signals (e.g., in the form of logic low and logic high control values) onto node 77 thereby causing first reference selector 64 to select $V_{refL}$ in response to logic high or $V_{refH}$ in response to logic low. (Alternatively, $V_{refL}$ could be selected in response to logic low and $V_{refH}$ in response to logic high). Using the example voltages in FIG. 15, $V_{refH}$=2.5V and $V_{refL}$=0.8V. For example purposes, first reference selector 64 outputs $V_{refH}$=2.5V during the First Capacitor Reset state. During this state, as shown in FIG. 9, both switch SW7 and switch SW8 of DAC 54 are in the closed position, thereby coupling first reference selector 64 to both first and second capacitors 66, 68. Thus, during the First Capacitor Reset state, the output of first reference selector 64 is driven on to first capacitor 66 and second capacitor 68.

As also shown in FIG. 9, the control signal at node 77 is input to inverter 264, which outputs an inverted control signal to second reference selector 164 of second DAC 154. Depending on the control signal, second reference selector 164 outputs either $V_{refH}$ or $V_{refL}$. For example, second reference selector 164 may be configured in the same manner as first reference selector 64. Thus, using the example where first reference selector 64 outputs $V_{refH}$ in response to a given control signal (e.g., logic low), then second reference selector 164 will output $V_{refL}$ in response to the inverted control signal (e.g., logic high) received via inverter 264. During this state, as shown in FIG. 9, both switch SW17 and switch SW18 of DAC 154 are in the closed position, which enables the output of second reference selector 164 to be driven on to third capacitor 166 and fourth capacitor 168.

During a "Second Capacitor Reset" state (shown in FIG. 10), first reference selector 64 outputs a second reference voltage value. If, for example, first reference selector 64 outputs $V_{refH}$ in response to a first control signal (e.g., a logic low at node 77) during the First Capacitor Reset state (FIG. 9), then first reference selector 64 will output $V_{refL}$ in response to a second control signal (e.g., a logic high at node 77) during the Second Capacitor Reset state. As shown FIG. 10, during the Second Capacitor Reset state, switch SW7 is in the open position, while switch SW8 remains closed. Thus, the output of first reference selector 64 is applied to only first capacitor 66.

Similarly, during the Second Capacitor Reset state, second reference selector receives an inverted second reference voltage signal (i.e., a second control signal) from node 77 (via inverter 264). In the preferred embodiment, second reference selector 164 and first reference selector 64 are similarly configured. Thus, for example where first reference selector 64 outputs $V_{refL}$ in response to a second reference voltage signal, then second reference selector 164 will output $V_{refH}$ in response to an inverted second reference voltage signal received via inverter 264.

Figure 11:
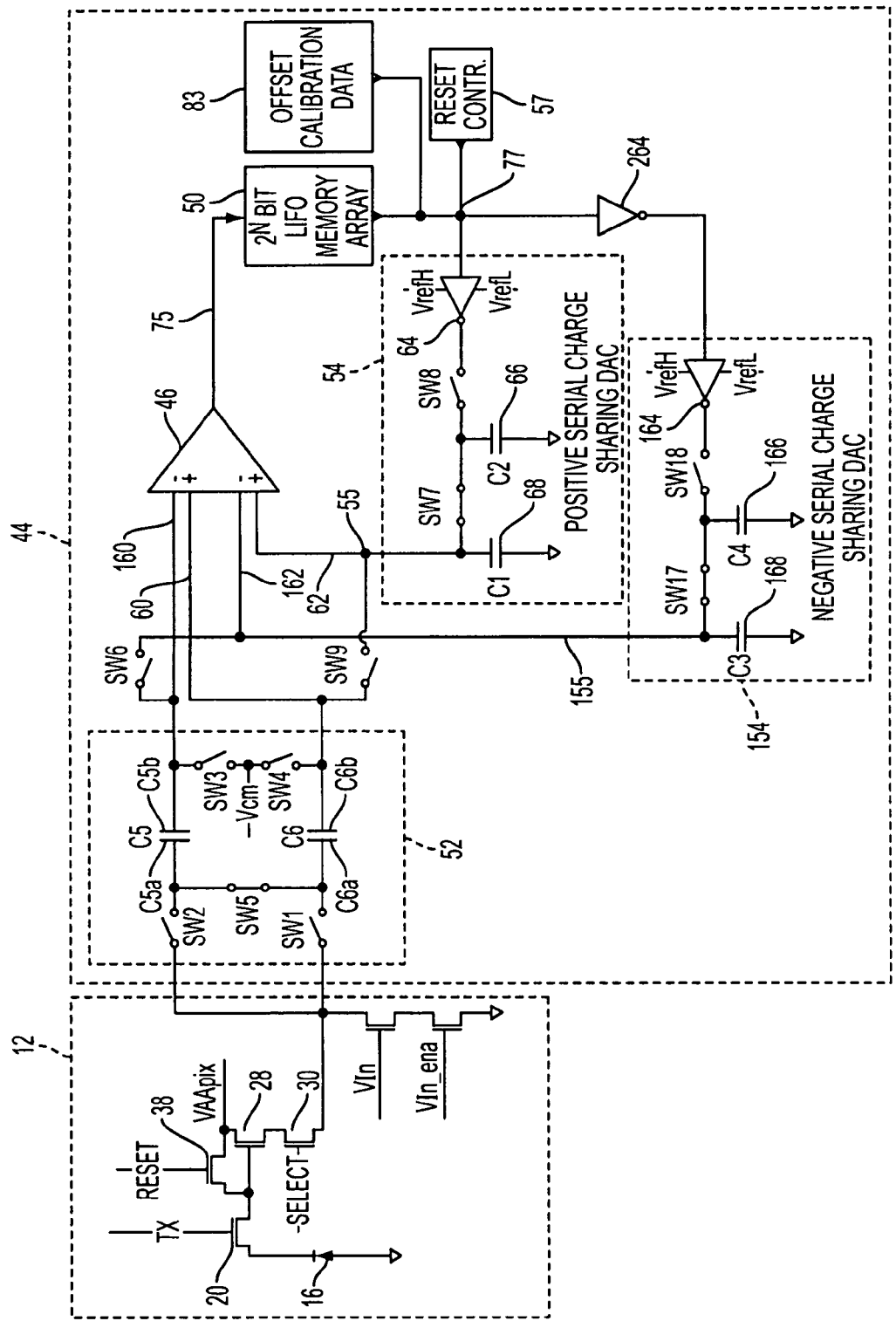
FIG. 11 is a schematic of an exemplary embodiment of the image sensor of FIG. 2A during an exemplary method of generating a bit in an N-bit series having a digital-to-analog converter reset voltage generated.

During a "Charge Sharing" state, as shown in FIG. 11, switch SW7 is in the closed position and switch SW8 is in the open position for first DAC 54. Similarly, switch SW17 is in the closed position and switch SW18 is in the open position for second DAC 154. This switch configuration generates a DAC reset voltage, $DAC_{reset}$, at the output of each first DAC 54 and second DAC 154. For each DAC circuit, the $DAC_{reset}$ is equal to the charge shared voltage of the DAC capacitors (e.g., the first capacitor 66 and second capacitor 168 of first DAC 64, and third capacitor 166 and fourth capacitor 168 for second DAC 168). In other words, for first DAC 54, the $DAC_{reset}$ is the charge shared voltage of first capacitor 66 ($V_{DAC1-cap1}$) and second capacitor 68 ($V_{DAC1-cap2}$):

$$½[V_{DAC1-cap1}+V_{DAC1-cap2}]=½[V_{refH}+V_{refL}] \quad (5)$$

Similarly, for second DAC 154, the $DAC_{reset}$ is the charge shared voltage of third capacitor 166 ($V_{DAC2-cap3}$) and fourth capacitor 168 ($V_{DAC2-cap4}$):

$$½[V_{DAC2-cap3}+V_{DAC2-cap4}]=½[V_{refL}+V_{refH}] \quad (6)$$

As shown in FIG. 15, using the example voltage values of $V_{refL}$=0.8V and $V_{refH}$=2.5V the $DAC_{reset}$ for each first DAC 54 and second DAC 154 is:

$$DAC_{reset}=½[0.8V+2.5V]=1.65V \quad (7)$$

An "MSB Bit Generation" state is now described with further reference to FIG. 11. The "MSB Bit Generation" state may be used to generate the most significant bit of an N-bit digital series. During this state, differential DAC voltage ($V_{DAC-diff}$) is generated using a first DAC 54 output voltage, $V_{DAC1}$ (which is applied to positive feedback line 62 of differential comparator 46), and a second DAC 154 output voltage, $V_{DAC2}$ (which is applied to negative feedback line 162). Differential comparator 46 is in the compare mode, and compares $V_{DAC-diff}$ to the incoming analog voltage signal, $V_{in-diff}$ (at input signal lines 60, 160). In accordance with the exemplary embodiment of FIG. 11, the MSB is generated after resetting both DAC circuits 54, 154, and therefore $V_{DAC1}=V_{DAC2}=DAC_{reset}$ (i.e., $½[V_{refL}+V_{refH}]$). Thus, equal signals appear at feedback lines 162, 62 (i.e., $V_{DAC1}=DAC_{reset}$ appears at positive feedback line 62, and $V_{DAC2}=DAC_{reset}$ appears at negative feedback line 162), and the differential voltage $V_{DAC-diff}$ is zero.

During the MSB Bit Generation state, differential comparator 46 is in compare mode and compares $V_{in-diff}$ to $V_{DAC-diff}$. Based on this comparison, differential comparator 46 outputs a digital output value and a corresponding value is stored in memory 50 as the MSB of the N-bit series. For example, differential comparator 46 may be configured such that if the voltage $V_{in-diff}$ at input signal lines 60, 160 is greater than $V_{DAC-diff}$ at feedback lines 62, 162, then differential comparator 46 outputs a digital high signal, which is stored in memory as a bit in the N-bit series (i.e., $bit_i$=high); and if the voltage $V_{in-diff}$ is not greater than $V_{DAC-diff}$, then differential comparator 46 outputs a digital low that is stored in memory 50 as $bit_i$=low.

Using the example voltage values shown in FIG. 15, $V_{DAC1}=V_{DAC2}=DAC_{reset}=1.65V$; $V_{in\text{-}diff}=0.53291V$; and $V_{DAC\text{-}diff}=0V$. Thus, for generation of the MSB (i.e., $bit_{N-1}$), $V_{in\text{-}diff}(0.53291V)$ is greater than $V_{DAC\text{-}diff}(0V)$. Therefore, differential comparator 46 outputs a digital high value, and a corresponding bit value is stored in memory 50 at MEM9 for the MSB. If, for example, exemplary memory 50a (shown in FIG. 3a) were used, the bit stored at store node 80 is a low (because first tri-state inverter 74 inverts the digital signal incoming via line 75), and the bit output to bit line bus BL (via inverter 76) is high. Note that other differential comparator configurations are also suitable—for example, the differential comparator 46 could be configured to output a digital low if $V_{in\text{-}diff} > V_{DAC\text{-}diff}$, and a digital high if $V_{in\text{-}diff} \leq V_{DAC\text{-}diff}$.

An exemplary method of generating a next successive bit, $bit_i$, in an N-bit series using the ADC 44 of FIG. 2A is now described with reference to FIGS. 9-13. For i=N-2, the MSB ($bit_{N-1}$) is used to generate the next successive bit in the N-bit series, $bit_{i=N-2}$. According to this exemplary method, a bit corresponding to the MSB has been previously generated and stored in memory 50. For example, the MSB bit may be generated and stored in memory 50 according the method previously described with reference to FIGS. 9-11.

Next, first capacitor 66 and second capacitor 68 of first DAC 54, and third capacitor 166 and fourth capacitor 168 of second DAC 154, are reset according to the First Capacitor Reset, Second Capacitor Reset, and Charge Sharing states described above with reference to FIGS. 9-11 such that the voltage at the output of each first DAC 54 and second DAC 154 is $DAC_{reset}=\frac{1}{2}(V_{refL}+V_{refH})$.

Figure 12:
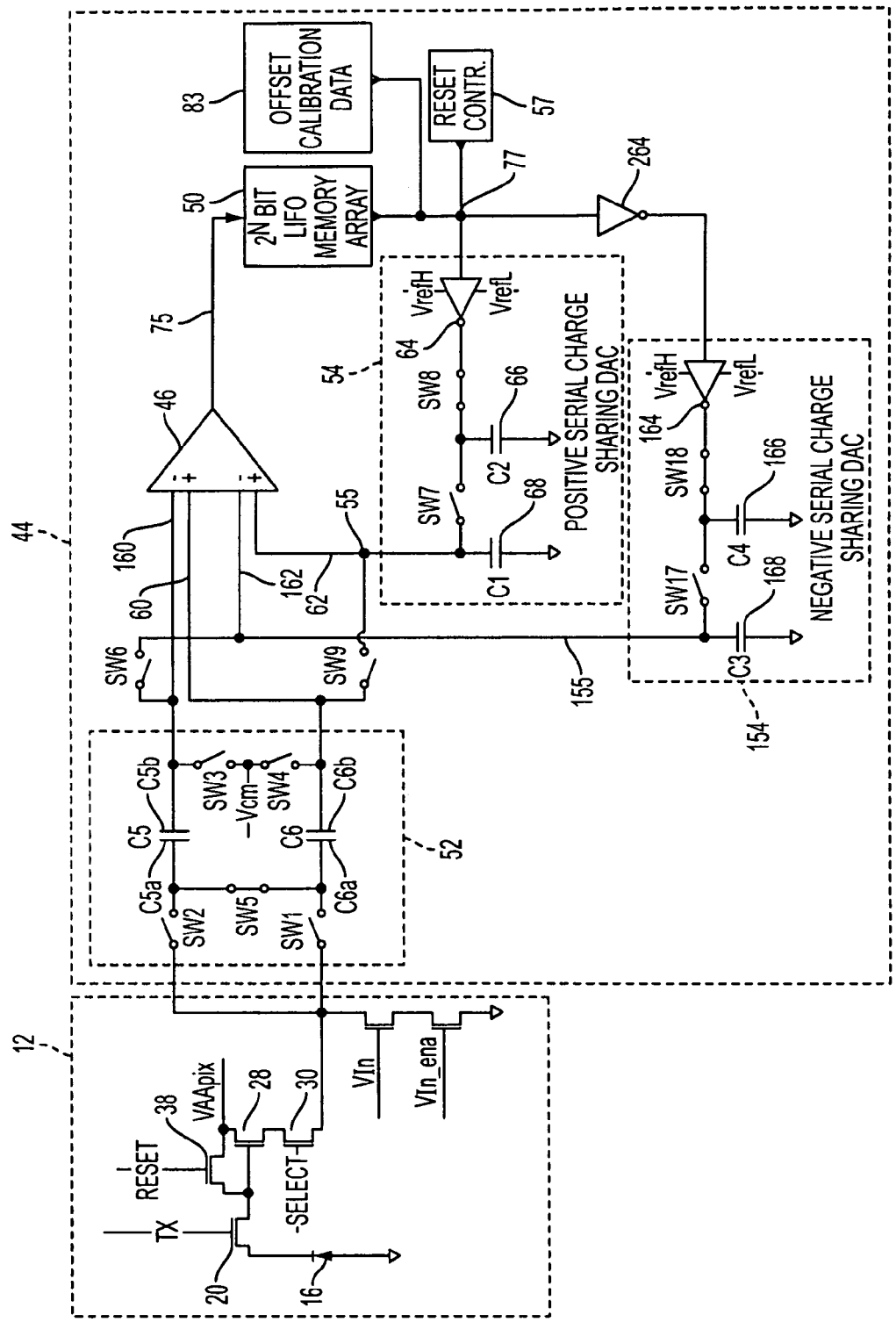
FIG. 12 is a schematic of an exemplary embodiment of the image sensor of FIG. 2A during an exemplary method of generating a bit in an N-bit series having a previously generated bit value applied to a pair of digital-to-analog converters.

As shown in FIG. 12, during a "Prior-Bit Feedback" state, a digital value corresponding to the previously generated bit ($bit_{i+1}$) is read from memory 50 and applied as an input to first reference selector 64 of first DAC 54. This digital value is also inverted and applied to second reference selector 164 of second DAC 154 (via inverter 264). Thus, in response to the prior bit value feedback from memory 50, second DAC 154 receives a digital value that is inverted from that received by first DAC 54. For i=N-2, memory 50 applies the previously generated bit, $bit_{i+1}$, where i+1=(N-2)+1=N-1. Thus, a digital value corresponding to the MSB, $bit_{N-1}$, is read from memory and applied to DACs 54, 154. For example, where a digital high is stored as the MSB, then a digital high is applied to first reference selector 64 of first DAC 54, and a digital low is applied to second reference selector 164 of second DAC 154.

First reference selector 64 and second reference selector 164 are each configured to output $V_{refH}$ if a low digital value is applied to its input, and further to output $V_{refL}$ if a digital high value is applied. It should be noted that other configurations are suitable, for example, $V_{refL}$ may be output if a digital low is applied at the input of first reference selector 64 or second reference selector 164. As shown in FIG. 12, for first DAC 54, switch SW8 is in the closed position and switch SW7 is in the open position, such that first reference selector 64 and first capacitor 66 are coupled together, but neither is coupled to second capacitor 68 or first DAC output line 55. Similarly, for second DAC 154, switch SW18 is in the closed position and switch SW17 is in the open position, such that second reference selector 164 and third capacitor 166 are coupled together, but neither is coupled to fourth capacitor 168 or second DAC output line 155. In this way, the first reference selector 64 drives a first reference voltage (e.g., $V_{refL}$) on to first capacitor 66 and second reference selector 164 drives a second reference voltage (e.g., $V_{refH}$) on to third capacitor 166. For example purposes, i=N-2 (the second most significant bit) and $bit_{i+1}$, is $bit_{N-1}$, the MSB. Using the example MSB value (high), as shown in FIG. 15, first reference selector 64 receives a digital high input corresponding to the MSB value from memory 50. First reference selector 64 then outputs $V_{refL}=0.8V$ which is applied to first capacitor 66. Similarly, second reference selector 164 receives a digital low input corresponding to the MSB value from memory 50 as inverted by inverter 264, and second reference selector 164 then outputs $V_{refL}=2.5V$ which is applied to third capacitor 166.

During a "Feedback Charge Share" state (shown in FIG. 13), switch SW8 is in the open position and switch SW7 is in the closed position. This causes first and second capacitors 66, 68 to charge share such that the first DAC 54 output on line 55 is equal to one half the combined sum of the voltages on the first capacitor 66 and second capacitor 68. The voltage on first capacitor 66 is the voltage output by first reference selector 64 (i.e., $V_{DAC1\text{-}cap1x}$ equals either $V_{refL}$ or $V_{refH}$, depending on which value is output by first reference selector 64). The voltage on second capacitor 68 is the previously generated first DAC output voltage. Second DAC 154 has a switch configuration similar to first DAC 54 (i.e., SW18 is open and SW17 is closed) and charge shares the voltages on third capacitor 166 and fourth capacitor 168, such that the second DAC 154 output equals one half the combined sum of the voltages at third capacitor 166 (i.e., $V_{DAC2\text{-}cap3x}$ equals either $V_{refH}$ or $V_{refL}$), and fourth capacitor 168 (the previously generated second DAC 154 output). Differential DAC output, $V_{DAC\text{-}diff}$, however, is not used for comparison to $V_{in\text{-}diff}$ for generation of $bit_i$ until the successive approximation process is complete for x=i+1 through x=N-1. Thus, until this successive approximation process is complete, the DAC output values are generated as temporary values. Thus, for first DAC 54, the DAC temporary output is:

$$V_{DAC1tempout\,(N-1)-x}=\frac{1}{2}[V_{DAC1\text{-}cap2}+V_{DAC1\text{-}cap1}]=\frac{1}{2}[V_{DAC1tempoutN-1-(x-1)}+(V_{DAC1\text{-}capx})] \quad (8)$$

Where $V_{DAC1tempout\,(N-1)-x}$ is the temporary DAC output being generated, $V_{DAC1tempoutN-1-(x\,1)}$ is the voltage on second DAC capacitor 68 (i.e., the previously generated temporary output voltage) and $V_{DAC1\text{-}capx}$ is the voltage on the first capacitor 66 (i.e., the reference selector 64 output ($V_{refL}$ or $V_{refH}$)).

Similarly, the DAC temporary output for second DAC 154 is:

$$V_{DAC2tempout\,(N-1)-x}=\frac{1}{2}[V_{DAC2\text{-}cap4}+V_{DAC2\text{-}cap3}]=\frac{1}{2}[V_{DAC2tempoutN-1-(x-1)}+(V_{DAC2\text{-}capx})] \quad (9)$$

During successive approximation, each of the previously generated bits (e.g., $bits_{i+1}$ through the MSB, $bit_{N-1}$) is successively applied to first DAC 54, and (in inverted form via invert 264) to second DAC 154 to generate temporary DAC outputs starting with the immediately previously generated $bit_{i+1}$ and ending with the MSB. Thus, x in equations [8] and [9] respectively identifies the current bit value that is being read out of memory and that is applied to first DAC reference selector 64 and second DAC reference selector 164 for the successive approximation. Thus, temporary DAC outputs are generated for DAC circuits 54, 154 until the successive approximation for a given $bit_i$ ends after a digital value corresponding to the MSB is input to first DAC 54 and (in inverted form) to second DAC 154.

According to the exemplary method, $V_{DAC1tempout\,(N-1)-x}$ and $V_{DAC2tempout0}$ signify that a digital value corresponding to the MSB has respectively been applied to first DAC reference selector 64 and (in inverted form) to second DAC reference selector 164. This indicates that successive approximation using all previously generated bits has occurred. Thus, the Prior-Bit Feedback and Feedback-Charge share states are repeated for x=i+1 through x=N−1, at which time $V_{DAC1tempout0}$ and $V_{DAC2tempout0}$ are generated. The outputs $V_{DAC1tempout0}$ ($V_{DAC1}$) and $V_{DAC2tempout0}$ ($V_{DAC2}$) are used to determine $V_{DAC-diffx=i}$ which is compared to $V_{in-diff}$ for generation of a digital value corresponding to $bit_i$.

To generate $bit_i$ of an N-bit series, equations [8] and [9] are determined for x=i+1, i+2, . . . N−1, where i+1 is the bit number of the immediately previously generated bit, and N−1 is the bit number of the MSB. For example, in an N-bit series where N=10 (i.e., a 10 bit series) having bits 9 through 0, the MSB is bit N−1=9. In such a series, the 3rd most significant bit is considered $bit_{i=N-3=7}$, and in order to generate this bit, a $V_{DAC-diffi}$ value for i=7 is calculated by calculating equations [8] and [9] for x values of x=8 (i.e. i+1), and x=9 (i.e., i+2), where x=9=N−1. As a result of this series of calculations, $V_{DAC1tempout0}$ (i.e. $V_{DAC1}$) and $V_{DAC2tempout0}$ (i.e., $V_{DAC2}$) are determined and their differential used to generate $V_{DAC-diffi=7}$. Alternatively, if the second most significant bit, $bit_{i=N-1=8}$, is being generated, then equations [8] and [9] are calculated for just x=i+1=9 in order to determine $V_{DAC1tempout0}$ and $V_{DAC2tempout0}$, and the differential of these two signals is used to determine $V_{DAC-diffi=8}$.

When generating a given $bit_i$, a digital bit value corresponding to $bit_{x=i+1}$ is the first digital bit value applied to first DAC reference selector 64, and (in inverted form) to second DAC reference selector 164 during successive approximation. Thus, when generating $bit_{i=N-2}$ (i.e., the second most significant bit), the first bit applied is $bit_{x=i+1=(N-2)+1=N-1}$ (i.e., the MSB). For x=N−1, equation [8] for first DAC 54 reduces to:

$$V_{DAC1tempout\,(N-1)-(N-1)} = \tfrac{1}{2}[V_{DAC1tempoutN-1-((N-1)-1)} + (V_{DAC1-capN-1})] = V_{DAC1tempout0} = \tfrac{1}{2}[V_{DAC1tempout1} + (V_{DAC1-capN-1})] \quad (10)$$

Similarly, for x=N−1, equation [9] for second DAC 164 reduces to:

$$V_{DAC2tempout\,(N-1)-(N-1)} = \tfrac{1}{2}[V_{DAC2tempoutN-1-((N-1)-1)} + (V_{DAC2-capN-1})] = V_{DAC2tempout0} = \tfrac{1}{2}[V_{DAC2tempout1} + (V_{DAC2-capN-1})] \quad (11)$$

Here, the previously generated DAC output voltage was the $DAC_{reset}$ that was used to reset DACs 54, 154 after generation of the MSB bit. Thus:

$$V_{DAC1tempoutN-1-((N-1)-1)} = V_{DAC1tempout1} = DAC_{reset} \quad (12)$$

$$V_{DAC2tempoutN-1-((N-1)-1)} = V_{DAC2tempout1} = DAC_{reset} \quad (13)$$

$V_{DAC1-CapN-1}$ is the voltage applied by first reference selector 64 to first capacitor 66 based on the value of $bit_{x=N-1}$ (i.e., the MSB). Similarly, $V_{DAC2-CapN-1}$ is the voltage applied by second reference selector 164 to third capacitor 166 based on the value of $bit_{x=N-1}$ (i.e., the MSB). Using the previously described example values (shown in FIG. 15), $DAC_{reset}$=1.65V, and the MSB is (high), first reference selector 66 outputs $V_{refL}$=0.8V and second reference selector 166 outputs $V_{refH}$=2.5V. Thus, equation [8] for the temporary output of first DAC 54, reduces to:

$$V_{DAC1tempout0} = \tfrac{1}{2}[DAC_{reset} + V_{refL}] = \tfrac{1}{2}[1.65V + 0.8V] = 1.225V \quad (14)$$

Equation [9] for the temporary output of second DAC 164, reduces to:

$$V_{DAC2tempout0} = \tfrac{1}{2}[DAC_{reset} + V_{refH}] = \tfrac{1}{2}[1.65V + 2.5V] = 2.075V \quad (15)$$

Generation of $V_{DAC1tempout\,0}$ and $V_{DAC2tempout\,0}$ signifies that successive approximation through $bit_{x=N-1}$ (i.e., the MSB has occurred).

Figure 13:
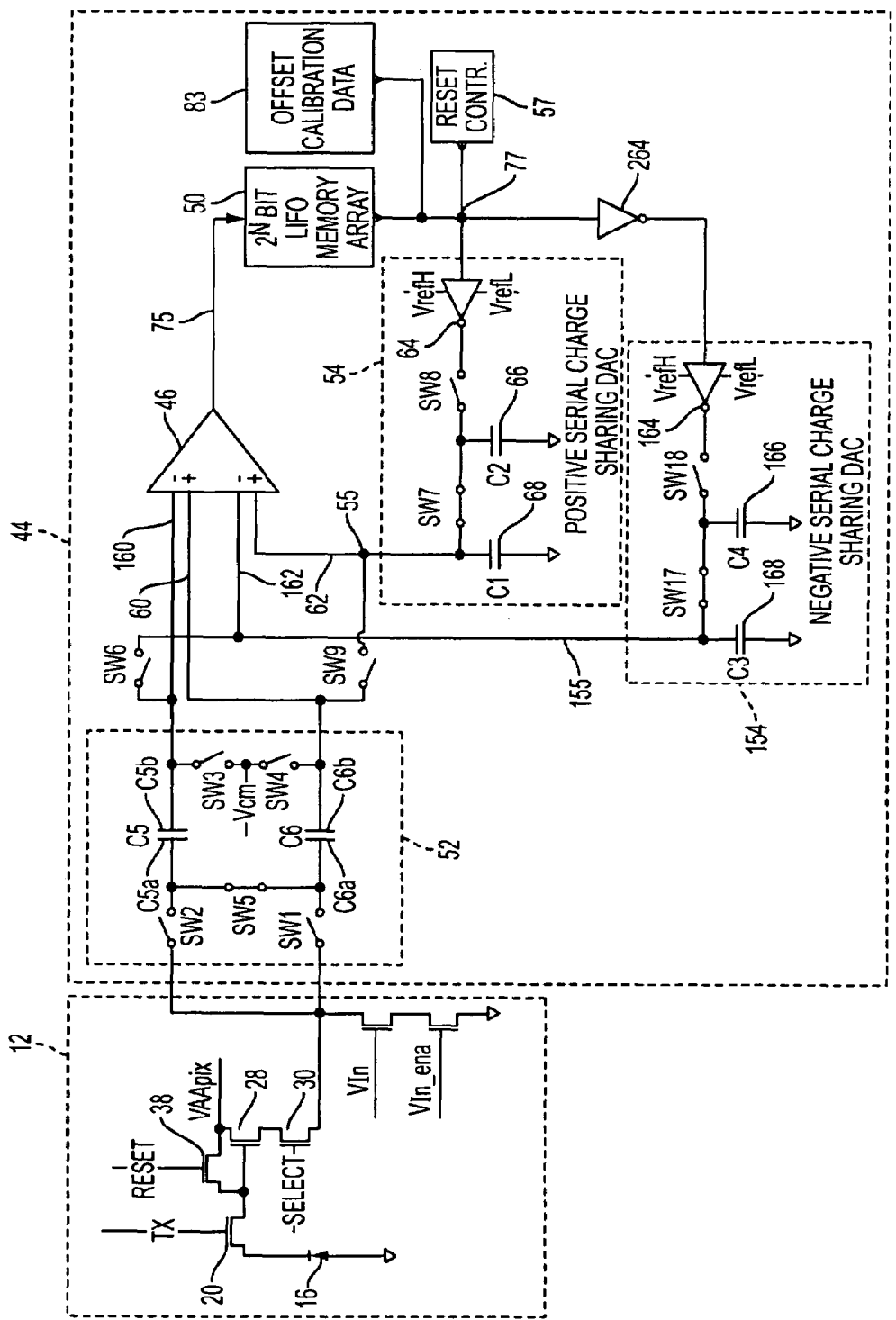
FIG. 13 is a schematic of an exemplary embodiment of the image sensor of FIG. 2A during an exemplary method of generating a bit in an N-bit series having a digital-to-analog converter output generated.

A Successive Bit Generation state is shown in FIG. 13. During this state, $V_{DAC-diffi}$, the differential voltage based on $V_{DAC1tempout\,0}$ (i.e., $V_{DAC1}$) and $V_{DAC2tempout\,0}$ (i.e., $V_{DAC2}$) is applied on positive feedback line 62 and negative feedback line 162 of differential comparator 46 and compared to $V_{in-diff}$ (on posse input signal line 60 and negative input signal line 160) for generation of a digital $bit_i$ in the N-bit series. For example, $bit_{i=N-2}$ can be calculated according the present method using the example value for N=10 (i.e., 10 bits), $V_{in-diff}$=0.53291V (as previously described with reference to FIGS. 9-11 and using the example values shown in FIG. 15), $V_{DAC1tempout\,0}$=1.225V (shown in equation [14] and FIG. 15), and $V_{DAC2tempout\,0}$=2.075V (shown in equation [15] and FIG. 15).

Using these values:

$$V_{DAC-diffi=N-2} = V_{DAC-diffi=8} = |V_{DAC1tempout\,0} - V_{DAC2tempout\,0}| = |1.225V - 2.075V| = 0.85V \quad (16)$$

Differential comparator 46 is in the compare mode, and compares $V_{DAC-diffi=8}$=0.85V to the incoming differential input signal, $V_{in-diff}$=0.53291V. The resultant output is a digital bit value that is stored in memory 50 as $bit_{N-2=8}$ of the N-bit series. For example purposes, during compare mode, differential comparator 46 is configured to output a digital low if $V_{in-diff}$ (0.53291V) is not greater than $V_{DAC-diffi}$ (e.g., 0.85V for i=N−2=8). Because $V_{in-diff}$ (0.53291V)$\leq V_{DAC-diffN-2}$ (0.85V), a digital value corresponding to the digital low is stored in memory 50 at MEM8 (FIG. 12) and represents the second most significant bit, $bit_{i=N-2}$.

The next successive bit, $bit_{i=N-3}$, of the N-bit series is generated as follows. First DAC 54 and second DAC 154 are each reset to $DAC_{reset}$=½[$V_{refL}$+$V_{refH}$] according to the First Capacitor Reset, Second Capacitor Reset and Charge Sharing states described above with reference to FIGS. 9-11 and equations [8] and [9]. Using the example voltage values described above (and shown in FIG. 15), $DAC_{reset}$=½[0.8V+2.5V]=1.65V.

Successive approximation begins as follows. A digital bit value corresponding to previously generated and stored $bit_{x=i+1}$ is read out from memory 50, and is applied to each first reference selector 64 and second reference selector 164 (after being inverted by inverter 264) in accordance with the Prior-Bit Feedback state previously described with reference to FIG. 12. During the Prior-Bit Feedback state, the first bit read from memory 50 for successive approximation of $bit_{i=N-3}$, is the immediately previously generated bit, $bit_{i+1}$.

Thus, a digital value corresponding to $bit_{(N-3)+1}$ (i.e., $bit_{N-2}$) is applied to first reference selector 64, and inverter 264. In first DAC 54, Switch SW8 is in the closed position and switch SW7 is in the open position, and based on the value of $bit_{N-2}$, first reference selector 64 outputs either $V_{refH}$ or $V_{refL}$ to first capacitor 66. Second DAC 154 receives an inverted signal from inverted signal from inverter 264, causing second reference selector 164 to output either $V_{refH}$ or $V_{refL}$. For example, in response to a given digital value output from memory 50, second reference selector 164 will output one voltage reference signal (e.g., $V_{refH}$), and first reference selector 64 will output a second voltage reference signal (e.g., $V_{refL}$).

Next, switch SW8 is in the open position, and switch SW7 is in the closed position, and a Feedback Charge Share state (previously described with reference to FIG. 13) results in charge sharing between (i) first and second capacitors 66, 68 of first DAC 54, and (ii) third and fourth capacitors 166, 168 of second DAC 154. For each DAC 54, 154, charge sharing produces a temporary voltage value at the DAC output, according to Equations [8] and [9] for x=N−2. For first DAC:

$$V_{DAC1tempout\ (N-1)-(N-2)} = \tfrac{1}{2}$$
$$[V_{DAC1tempoutN-1-((N-2)-1)} + (V_{DAC1-capN-2})] =$$
$$V_{DAC1tempout\ 1} = \tfrac{1}{2}[V_{DAC1tempout2} + (V_{DAC1-capN-2})] \quad (17)$$

For second DAC 164:

$$V_{DAC2tempout\ (N-1)-(N-2)} = \tfrac{1}{2}$$
$$[V_{DAC2tempoutN-1-((N-2)-1)} + (V_{DAC2-capN-2})] =$$
$$V_{DAC2tempout\ 1} = \tfrac{1}{2}[V_{DAC2tempout2} + (V_{DAC2-capN-2})] \quad (18)$$

Where: $V_{DAC1-capN-2}$ is the voltage output by first DAC reference selector 64 ($V_{refH}$ or $V_{refL}$) corresponding to $bit_{x=N-2}$; $V_{DAC2-capN-2}$ is the voltage output by second DAC reference selector 164 ($V_{refH}$ or $V_{refL}$) corresponding to $bit_{x=N-2}$; and $V_{DAC2tempout2}$ and $V_{DAC1tempout2}$ are the previously generated second DAC 154, first DAC 54 outputs, respectively. Because DACs 54, 154 are reset before beginning the first prior bit feedback, each DAC output is equal to $DAC_{reset}$ when performing the successive approximation stage for i=x+1. Because the $V_{DAC1tempout\ 0}$ and $V_{DAC2tempout\ 0}$ have not been generated, the successive approximation process continues, and a differential DAC voltage for bit N−3, $V_{DAC-diffN-3}$ is not yet generated for comparison to $V_{in-diff}$ (i.e., for generation of the digital bit value corresponding to $bit_{i=N-3}$).

Next the first DAC 54 output ($V_{DAC1tempout\ (N-1)-x}$) and the second DAC 154 output ($V_{DAC2tempout\ (N-1)-x}$) are determined for x=i+2. Because $bit_{i=N-3}$ is being generated, x=i+2=(N−3+2)=N−1. For first DAC 54, switch SW8 is in the closed position and switch SW7 is in the open position (so that first reference selector 64 is coupled to only first capacitor 66) as shown in FIG. 12. For second DAC 154, switch SW18 is in the closed position and switch SW17 is in the open position (so that second reference selector 164 is coupled to only third capacitor 166) as also shown in FIG. 12. As previously described with reference to FIG. 12, depending on the value of $bit_{N-1}$, first DAC reference selector 64 outputs $V_{refH}$ (or $V_{refL}$) to first capacitor 66 and second DAC reference selector 164 outputs $V_{refL}$ (or $V_{refH}$) to third capacitor 166.

Next, as previously described with reference to FIG. 13, for first DAC 54, switch SW8 is opened and switch SW7 is closed and, for second DAC 154, switch SW18 is opened and switch SW17 is closed. The foregoing switch configurations enable the first and second capacitors of each DAC 54, 154 to enter the feedback Charge Share state (as previously described with reference to FIG. 13), such that a DAC output signal is generated for x=N−1 for first DAC 54 according to Equation [8]:

$$V_{DAC1tempout\ (N-1)-(N-1)} = \tfrac{1}{2}$$
$$[V_{DAC1tempoutN-1-((N-1)-1)} + (V_{DAC1-capN-1})] =$$
$$V_{DAC1tempout\ 0} = \tfrac{1}{2}[V_{DAC1tempout1} + (V_{DAC1-capN-1})] \quad (19)$$

And for second DAC 154 according to Equation [9]:

$$V_{DAC2tempout\ (N-1)-(N-1)} = \tfrac{1}{2}$$
$$[V_{DAC2tempoutN-1-((N-1)-1)} + (V_{DAC2-capN-1})] =$$
$$V_{DAC2tempout\ 0} = \tfrac{1}{2}[V_{DAC2tempout1} + (V_{DAC2-capN-1})] \quad (20)$$

Where $V_{DAC2tempout1}$ and $V_{DAC1tempout1}$ are the immediately previously generated DAC output values for second DAC 154 and fist DAC 54, respectively (i.e., the DAC output values generated during the successive approximation for x=i+1); and $V_{DAC1-capN-1}$ and $V_{DAC2-capN-1}$ are the voltages ($V_{refH}$ or $V_{refL}$) that are output by first reference selector 64 and second reference selector 164, respectively, in response to a digital value corresponding to $bit_{N-1}$ (i.e. the MSB).

Generation of $V_{DAC2tempout0}$ and $V_{DAC1tempout0}$ signifies that the Prior Bit Feedback and Feedback Charge Share states have been repeated for x=i+1 through x=N−1 and successive approximation in the feedback loop is complete for $bit_i$.

$V_{DAC2tempout0}$ and $V_{DAC1tempout0}$ are used to generate $V_{DAC-diffi=N-3}$, which is compared to $V_{in-diff}$ for generation of a digital value corresponding to $bit_i$. $V_{DAC-diffi=N-3}$ is input to differential comparator 46 and compared to $V_{in-diff}$ to generate biter according to the Successive Bit Generation state previously described with reference to FIG. 13.

Using the example voltage values previously defined, MSB $bit_{x=N-1}$ was previously generated as a digital high (FIG. 12), and the second most significant bit, $bit_{x=N-2}$ was previously generated as a digital low (FIG. 12). $Bit_{i=N-3}$ can then be determined as follows.

The DAC output values for the DACs 54, 154 are each reset to $DAC_{reset} = \tfrac{1}{2}[V_{refL} + V_{refH}] = 1.65V$ according to the First Capacitor Reset, Second Capacitor Reset, and Charge Sharing states previously described above with reference to FIGS. 9-11. Next, according to the Prior-Bit F back state described above with reference to FIG. 12, switch SW8 is in the closed position and switch SW7 is in the open position.

Successive approximation is applied beginning with x=i+1 and ending with x=N−1. Because $bit_{i=N-3}$ is being generated, x=i+1=(N−3)+1=N−2. Thus, the first digital bit value output from memory 50 and applied to positive reference selector 64 corresponds to $bit_{x=N-2}$ (a logic low). Thus, using the values of FIG. 15, memory 50 outputs a logic low. This logic low is applied to first reference selector 64 which outputs $V_{refH}$=2.5V to first capacitor 66. The logic low from memory 50 corresponding to $bit_{x=N-2}$ is also applied to inverter 264 which applies a logic high to second reference selector 164 which outputs $V_{refL}$=0.8V to third capacitor 166.

Next, according to the Feedback Charge Share state (described above with reference to FIG. 13) the first and second capacitors of first DAC 54 and the third and fourth capacitors of second DAC 154 are charge shared to produce a temporary DAC output voltage for each DAC circuit 54, 154. For first DAC 54 x=i+1, the voltage on first capacitor 66 is $V_{DAC1capi-1}=V_{refH}$=2.5V and the voltage on second capacitor 68 is the previously generated DAC output $V_{DAC1tempout(N-1)-(x-1)} = DAC_{reset}$ (e.g., 1.65V) (shown in FIG. 15 for bit i=N−3=7 at x=i+1). Because the DAC is reset before generating a given bit, the DAC output voltage is $DAC_{reset}$ the first time a previously generated bit (i.e., $bit_{x=i+1}$) is read into either DAC 54 or 154 for successive approximation. This results in a temporary DAC output (as shown in FIG. 15) being generated at the output of first DAC 54 in accordance with equation [8] for x=N−2:

$$V_{DAC1tempout\ (N-1)-(N-2)} = \tfrac{1}{2}[DAC_{reset} + V_{DAC1cap\ N-2}] \quad (21)$$

$$V_{DAC1tempout1} = \tfrac{1}{2}[1.65V + 2.5V] = 2.75V \quad (22)$$

This temporary voltage is stored at second capacitor 68.

Similarly a temporary output for second DAC 154 is generated by charge sharing third capacitor 166 and fourth capacitor 168 in accordance with equation [9] for x=N−2 (shown in FIG. 15 for bit i=7 at x=i+1):

$$V_{DAC2tempout\ (N-1)-(N-2)} = \tfrac{1}{2}[DAC_{reset} + V_{DAC2cap\ N-2}] \quad (23)$$

$$V_{DAC2tempout1} = \tfrac{1}{2}[1.65V + 0.8V] = 1.225V \quad (24)$$

This temporary voltage is stored at fourth capacitor 168.

Next, $V_{DAC1tempout(N-1)-X}$ and $V_{DAC2tempout(N-1)-X}$ are determined for x=i+2. $Bit_{x=i+2}$ is output from memory 50 and applied to DAC circuits 54, 154 in accordance with the Prior Bit Feedback state. Since i=N−3, and x=i+2, therefore x=[(N−3)+2]=N−1, and the MSB, $bit_{x=N-1}$, is output from memory for application to first DAC 54 and second DAC 154. Using the example values, $bit_{x=N-1}$ was previously calculated as a digital high. Therefore, memory 50 outputs a logic high which is applied to first reference selector 64, and inverter 264.

In response to the logic high, first reference selector 64 outputs $V_{refL}$=0.8V which is held at first capacitor 66 as $V_{DAC1capN-1}$ (shown in FIG. 15 for $bit_{i=7}$ at x=i+2=9). The logic high from memory 50 is inverted to a logic low by inverter 264 and applied to second reference selector 164. In response to this logic low, second reference selector 164 outputs $V_{refH}$=2.5V which is held at third capacitor 166 as $V_{DAC2capN-1}$ (shown in FIG. 15 for $bit_{i=7}$ at x=i+2=9).

Next, in accordance with the feedback charge share state illustrated in FIGS. 13 and 15 (for biti=7 at x–i+2), the voltages on the first capacitor 66 and second capacitor 68 of first DAC 54 are charge shared to produce a temporary DAC output voltage:

$$V_{DAC1tempout\ (N-1)-(N-1)} = \tfrac{1}{2} [V_{DAC1tempoutN-1-((N-1)-1)} + V_{DAC1cap\ N-1}] \quad (25)$$

$$V_{DAC1tempout0} = \tfrac{1}{2}[V_{DAC1tempoutN-1} + V_{DAC1cap\ N-1}] \quad (26)$$

$$V_{DAC1tempout0} = [2.075V + 0.8V] = 1.4375V \quad (27)$$

Similarly the voltages on the third capacitor 166 and fourth capacitor 168 of second DAC 154 are charge shared to produce a temporary DAC output voltage:

$$V_{DAC2tempout\ (N-1)-(N-1)} = \tfrac{1}{2} [V_{DAC2tempoutN-1-((N-1)-1)} + V_{DAC2cap\ N-1}] \quad (28)$$

$$V_{DAC2tempout0} = \tfrac{1}{2}[V_{DAC2tempoutN-1} + V_{DAC2cap\ N-1}] \quad (29)$$

$$V_{DAC2tempout0} = [1.225V + 2.5V] = 1.8625V \quad (30)$$

$V_{DAC2tempout0}$ and $V_{DAC1tempout0}$ signifies that successive approximation using $bit_{x=i+1}$ through $bit_{x=N-1}$ is complete. $V_{DAC2tempout0}$ (i.e., $V_{DAC2}$) and $V_{DAC1tempout0}$ (i.e., $V_{DAC1}$) are used to generate $V_{DAC-diffi=N-3}$ which is compared to $V_{in-diff}$ for generation of $bit_{i=3}$ of the N-bit series.

Based on the comparison of $V_{DAC-diffi=N-3}$ to $V_{in-diff}$, differential comparator 46 outputs a digital value. In the present example, $$V_{DAC-diffi=N-3} = |V_{DAC1tempout0} - V_{DAC2tempout0}| = |1.4375V - 1.8625V| = 0.425V \quad (31)$$

$V_{in-diff}$ (0.53291V) is greater than $V_{DAC-diffi=N-3}$ (0.425V); therefore differential comparator 46 outputs a digital high value, and a corresponding digital bit is stored in memory 50 as $bit_{N-3}$ of the N-bit digital series.

In the same manner as previously described for $bit_{i=N-3}$ with reference to FIGS. 9-13, a successive bit; in the N-bit digital series may be generated by performing the First Capacitor Reset, Second Capacitor Reset, and Charge Sharing states described with reference to FIGS. 9-11. Successive DAC output values ($DAC_{tempout(N-1)-x}$) may be generated according to the Prior Bit Feedback and Feedback Charge Share states and according to FIGS. 12 and 13, and equations [8] and [9] for x=i+1, i+2, ... N–1. After successive approximation for x=N–1, a DAC differential voltage, $V_{DAC-diffi}$ is generated. According to the Successive Bit Generation state described with reference to FIG. 13, $V_{DAC-diffi}$ is applied to differential comparator 46 (via lines 62, 162), and compared to $V_{in-diff}$. Based on this comparison, a digital value is output from differential comparator 46 and corresponding bit, stored in memory 50.

Figure 14C:
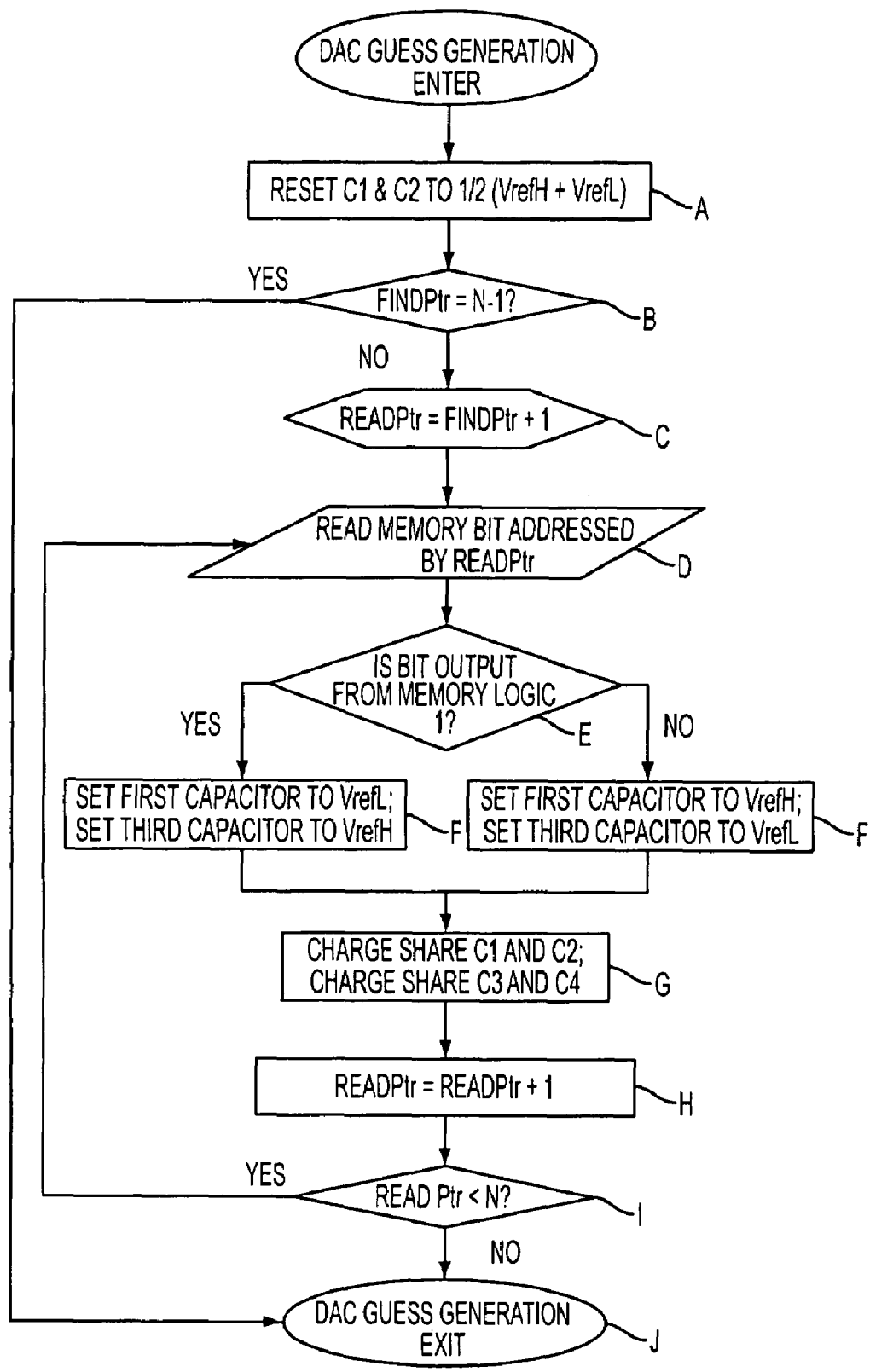
FIG. 14C is a flowchart of an exemplary embodiment of using address pointers during the exemplary method of FIGS. 9-13.

FIG. 14C illustrates an exemplary pointer flow for generating $V_{DAC1tempout0}$ and $V_{DAC2tempout0}$. As shown in FIG. 14C step A, DACs 54, 154 are reset. For example, each first DAC 54 and second DAC 154 are reset to ½($V_{refH}+V_{refL}$) in accordance with the First Capacitor Reset, Second Capacitor Reset and Charge Sharing states described above with reference to FIGS. 9-11. As shown in FIG. 14C, FINDPTR points to a bit address i, in which a digital value corresponding to the bit currently being generated by ADC 44 (i.e., $bit_i$), will be stored. If, as shown in step B, FINDPTR is pointing to address N–1, which corresponds to $bit_{N-1}$, the MSB is being generated and the process exits to Step J as additional successive approximation steps are not needed (i.e., when generating the MSB, there are no prior bits to be read back in to the DAC circuits 54, 154 for approximation). If, as shown in FIG. 14C step B, FINDPTR is not pointing to address N–1 (which indicates the MSB has already been generated), then the process continues for steps C through I to perform successive approximate to generate DAC output values used to calculate $V_{DAC-diffi}$.

At Step C, a pointer, READPTR is set to FINDPTR +1. FINDPTR corresponds to the bit being generated, thus for $bit_i$, FINDPTR corresponds to i. This causes READPTR to point to address i+1, which contains a digital value corresponding to $bit_{i+1}$. At step D, a digital value corresponding to $bit_{i+1}$ is applied to DACs 54, 154 (as previously described with reference to the Prior-Bit Feedback state and FIG. 12). At step E a reference value is output based on the value of $bit_{i+1}$. For example, as previously described with reference to the Prior-Bit Feedback state and FIG. 12, DAC circuits 54, 154 may be configured such that in response to memory 50 outputting $bit_{i+1}$=logic high (e.g., logic 1), first reference selectors 64 outputs $V_{refL}$, and second reference selector 164 (which receives a logic low via inverter 264) outputs $V_{refH}$. Thus, if at Step E, the digital value corresponding to $bit_{i+1}$ is logical high, first capacitor 66 is set to $V_{refL}$ and third capacitor 166 is set to $V_{refH}$ (step F); otherwise first capacitor 66 is set to $V_{refH}$ and third capacitor 166 is set to $V_{refL}$ (step F).

At step G, first capacitor 66 and second capacitor 68 charge share such that the output of first DAC 54 is one half the sum of the voltages on first capacitor 66 and second capacitor 68, as previously described with reference to the Feedback Charge Share state and FIG. 13. Third capacitor 166 and fourth capacitor 168 are similarly charge shared.

At step H, READPTR is incremented so that it now points to $bit_{i+2}$, and if, at step I, the READPTR is less than N, the process loops back to step D. Steps D-I are repeated until READPTR is no longer less than N (which signifies that the digital value corresponding to the MSB has been read in and applied to first DAC 54 and (via inverter 264) to second DAC 54 through successive approximation for generation of $V_{DAC-diffi}$). The process then exits to Step J.

Figure 16:
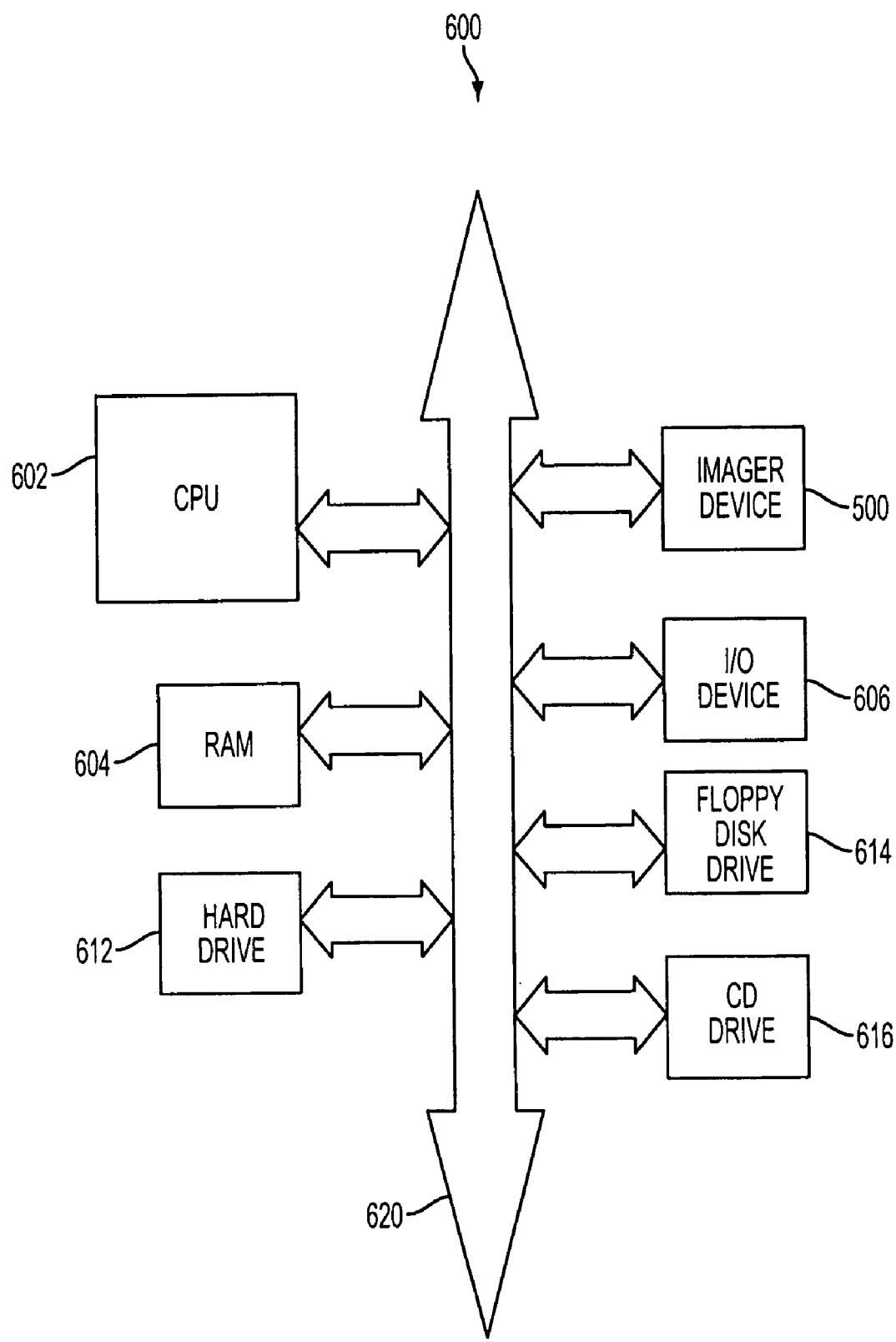
FIG. 16 is a diagram of a processor system incorporating an image sensor comprising an analog-to-digital converter constructed in accordance with an exemplary embodiment of the invention.

FIG. 16 shows system 600, a typical processor based system modified to include an imager device 500 comprising an ADC of the present invention. Examples of processor based systems, which may employ the imager device 500, include, without limitation, computer systems, camera systems, scanners, machine vision systems, vehicle navigation systems, video telephones, surveillance systems, auto focus systems, star tracker systems, motion detection systems, image stabilization systems, and others.

System 600 includes a central processing unit (CPU) 602 that communicates with various devices over a bus 620. Some of devices connected to the bus 620 provide communication into and out of the system 600, illustratively including an input/output (I/O) device 606 and imager device 500. Other devices connected to the bus 620 provide memory, illustratively including a random access memory (RAM) 604, hard drive 612, and one or more peripheral memory devices such as a floppy disk drive 614 and compact disk (CD) drive 616. The imager device 500 may be combined with a processor, such as a CPU, digital signal processor, or microprocessor, in a single integrated circuit. The imager device 500 may be a CCD imager or CMOS imager constructed in accordance with any of the illustrated embodiments.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A method for generating a digital-to-analog converter reset voltage, said method comprising:
   applying a first control signal to each of a first digital-to-analog converter and a second digital-to-analog converter, said step of applying a first control signal comprising,
      applying the first control signal to a first reference selector of the first digital-to-analog converter, wherein the first reference selector, in response to the first control signal, generates the first analog reference voltage and applies said first analog reference voltage to a first capacitor and a second capacitor of the first digital-to-analog converter, and
      inverting the first control signal and applying the inverted first control signal to a second reference selector of the second digital-to-analog converter, wherein the second reference selector, in response to the inverted first control signal generates the second analog reference voltage, and applies the second analog reference voltage to a third capacitor and a fourth capacitor of the second digital-to-analog converter;
   applying a second control signal to each the first digital-to-analog converter and the second digital-to-analog converter, said step of applying a second control signal comprising,
      applying the second control signal to the first reference selector, wherein the first reference selector generates the second analog reference voltage, and applies the second analog reference voltage to the first capacitor of the first digital-to-analog converter, and
      inverting the second control signal and applying the inverted second control signal to the second reference selector, wherein the second reference selector generates the first analog reference voltage, and applies the first analog reference voltage to the third capacitor of the second digital-to-analog converter;
   charge sharing said first capacitor and second capacitor to generate a first analog reset voltage at the first digital-to-analog converter; and
   charge sharing said third and fourth capacitors to generate a second analog reset voltage at the second digital-to-analog converter.

2. The method for generating a digital-to-analog converter reset voltage of claim 1,
   wherein said first digital-to-analog converter further comprises a first switch for coupling said first reference selector to said first capacitor and second capacitor; and a second switch for coupling said second capacitor and a first feedback output line to said first capacitor and said first reference selector, and
   wherein said second digital-to-analog converter further comprises a third switch for coupling said second reference selector to said third capacitor and fourth capacitor; and a fourth switch for coupling said fourth capacitor and a second feedback output line to said third capacitor and said second reference selector.

3. The method for generating a digital-to-analog conversion reset voltage of claim 2,
   wherein the step of applying the first control signal to each of the first and second digital-to-analog converters further comprises:
      closing the first and second switch of the first digital-to-analog converter; and
      closing the third and fourth switch of the second digital-to analog converter,
   wherein the step of applying the second control signal to each of the first and second digital-to-analog converters further comprises:
      opening the second switch of the first digital-to-analog converter; and
      opening the fourth switch of the second digital-to analog converter,
   wherein the step of charge sharing said first capacitor and second capacitor comprises:
      closing the first switch of the first digital-to-analog converter; and
      opening the second switch of the first digital-to-analog converter, and
   wherein the step of charge sharing said third capacitor and fourth capacitor comprises:
      closing the third switch of the second digital-to-analog converter; and
      opening the fourth switch of the second digital-to-analog converter.

4. The method for generating a digital-to-analog conversion reset voltage of claim 1, further comprising the step of generating a most significant bit of a N-bit series, comprising:
   applying a first differential analog input signal to a differential comparator;
   generating a second differential analog input signal based on said first analog reset voltage and said second analog reset voltage;
   applying said second differential analog input signal to the differential comparator; and
   comparing said first differential analog input signal to said second differential analog input signal, and outputting from the differential comparator a digital output signal based on the results of said comparing.

5. The method for generating a digital-to-analog conversion reset voltage of claim 1, wherein said first control signal is one of a logical high signal and a logical low signal, and said second control signal is the other of said logical high signal and said logical low signal.

6. The method for generating a digital-to-analog conversion reset voltage of claim 1, wherein said first and second control signals are received from a reset control circuit.

7. The method for generating a digital-to-analog conversion reset voltage of claim 1, wherein said first capacitor and said second capacitor are matched capacitors, and said third capacitor and said fourth capacitor are matched capacitors.

8. The method for generating a digital-to-analog conversion reset voltage of claim 1, wherein the rest signals are applied to corresponding positive and negative inputs of a differential comparator.

9. The method for generating a digital-to-analog conversion reset voltage of claim 1, wherein the differential comparator is part of an analog-to-digital converter circuit.

10. The method for generating a digital-to-analog conversion reset voltage of claim 9, wherein the reset control circuit generates a first control signal prior to an analog-to-digital conversion by the analog-to-digital converter circuit.

* * * * *